(12) United States Patent
Takahashi et al.

(10) Patent No.: US 12,256,605 B2
(45) Date of Patent: Mar. 18, 2025

(54) ELECTRONIC DEVICE, DISPLAY APPARATUS, PHOTOELECTRIC CONVERSION APPARATUS, ELECTRONIC EQUIPMENT, ILLUMINATION APPARATUS, AND MOVING OBJECT

(71) Applicant: CANON KABUSHIKI KAISHA, Tokyo (JP)

(72) Inventors: Tetsuo Takahashi, Kanagawa (JP); Takayuki Ito, Kanagawa (JP); Hiroaki Sano, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 615 days.

(21) Appl. No.: 17/503,913

(22) Filed: Oct. 18, 2021

(65) Prior Publication Data

US 2022/0130925 A1    Apr. 28, 2022

(30) Foreign Application Priority Data

Oct. 23, 2020    (JP) .................................. 2020-178127

(51) Int. Cl.
*H10K 59/122*    (2023.01)
*F21S 43/145*    (2018.01)
(Continued)

(52) U.S. Cl.
CPC .......... *H10K 59/122* (2023.02); *F21S 43/145* (2018.01); *F21V 3/00* (2013.01);
(Continued)

(58) Field of Classification Search
CPC ..................................................... F21S 43/145
See application file for complete search history.

(56) References Cited

U.S. PATENT DOCUMENTS 10,263,218 B2 *   4/2019   Shiratori ................ H10K 50/11
2013/0049028 A1 *   2/2013   Kim .................. H10K 59/80518
438/34

(Continued)

FOREIGN PATENT DOCUMENTS

JP    2009277590 A    11/2009
JP    2010056017 A    3/2010
(Continued)

*Primary Examiner* — Fatima N Farokhrooz
(74) *Attorney, Agent, or Firm* — Canon U.S.A., Inc. I.P. Division

(57) ABSTRACT

An electronic device including elements arranged on a substrate, each of the elements including an insulating layer, a first electrode, a functional layer, and a second electrode in mentioned order starting from a side closer to the substrate. The insulating layer has an inclined portion that is inclined relative to the substrate. The first electrode has a first portion positioned on the inclined portion and a second portion in contact with the functional layer. The second portion has a smaller inclination angle relative to the substrate than the first portion. A thickness of the functional layer positioned on the first portion in a direction normal to a functional layer surface in contact with the first portion is smaller than a thickness of the functional layer positioned on the second portion in a direction normal to a functional layer surface in contact with the second portion.

16 Claims, 16 Drawing Sheets

(51) Int. Cl.
F21V 3/00 (2015.01)
F21V 9/00 (2018.01)
G06F 3/01 (2006.01)
H10K 50/11 (2023.01)
H10K 50/813 (2023.01)
F21Y 115/15 (2016.01)
H10K 50/852 (2023.01)
H10K 59/30 (2023.01)
H10K 59/38 (2023.01)
H10K 102/00 (2023.01)

(52) U.S. Cl.
CPC ............... F21V 9/00 (2013.01); G06F 3/013 (2013.01); H10K 50/11 (2023.02); H10K 50/813 (2023.02); F21Y 2115/15 (2016.08); H10K 50/852 (2023.02); H10K 59/30 (2023.02); H10K 59/38 (2023.02); H10K 2102/351 (2023.02)

(56) References Cited

U.S. PATENT DOCUMENTS

| | | | |
|---|---|---|---|
| 2018/0006256 A1* | 1/2018 | Tojo | H05B 33/145 |
| 2018/0211979 A1* | 7/2018 | Lee | H10K 50/115 |
| 2019/0181188 A1 | 6/2019 | Youn | |
| 2021/0143236 A1* | 5/2021 | Kim | H10K 59/352 |

FOREIGN PATENT DOCUMENTS

| | | |
|---|---|---|
| JP | 2011159419 A | 8/2011 |
| JP | 2013030476 A | 2/2013 |
| JP | 2015138612 A | 7/2015 |
| JP | 2017091802 A | 5/2017 |
| JP | 2020098785 A | 6/2020 |
| JP | 2020136260 A | 8/2020 |
| WO | 2020105544 A1 | 5/2020 |

* cited by examiner

ELECTRONIC DEVICE, DISPLAY APPARATUS, PHOTOELECTRIC CONVERSION APPARATUS, ELECTRONIC EQUIPMENT, ILLUMINATION APPARATUS, AND MOVING OBJECT

BACKGROUND OF THE INVENTION

Field of the Invention

The present disclosure relates to an electronic device, a display apparatus, a photoelectric conversion apparatus, an electronic equipment, an illumination apparatus, and a moving object.

Description of the Related Art

An organic light emitting element and an organic photoelectric conversion element are proposed as electronic devices using organic layers (also called organic compound layers). The organic light emitting element includes a cathode, an anode, and the organic layer positioned between the cathode and the anode, and operates as a light emitting device that emits light with recombination of electrons injected from the cathode and holes injected from the anode. The organic photoelectric conversion element includes a cathode, an anode, and the organic layer positioned between the cathode and the anode, and operates as a photoelectric conversion device that takes out electrons and holes from the cathode and the anode, respectively, the electrons and the holes being generated by the organic layer upon absorbing light. A display apparatus including the organic light emitting element and an imaging apparatus including the organic photoelectric conversion element have attracted attention in recent years.

In the electronic device using the organic layer, the organic layer is continuously formed over multiple organic light emitting elements or multiple organic photoelectric conversion elements in some cases. In those cases, a current is likely to leak through the organic layer between independent electrodes (cathodes or anodes) in the adjacent elements. If a current leak occurs between adjacent ones of the organic light emitting elements, unintended light emission is caused in the organic light emitting elements, and a color gamut of the display apparatus is narrowed. If a current leak occurs between adjacent ones of the organic photoelectric conversion elements, noise is generated. Thus, the current leak between the adjacent elements deteriorates characteristics of the electronic device.

Japanese Patent Laid-Open No. 2020-136260 discloses an electronic device in which an insulating layer is disposed to cover end portions of lower electrodes included in the adjacent elements. The insulating layer has inclined portions positioned on the lower electrodes, and an organic layer is continuously formed on the inclined portions over the multiple elements. Japanese Patent Laid-Open No. 2020-136260 states that a thickness of the organic layer arranged on the inclined portion of the insulating layer is set to a predetermined value or greater from the viewpoint of suppressing a current leak between an upper electrode and the lower electrode while suppressing the current leak between the lower electrodes included in the adjacent elements.

According to Japanese Patent Laid-Open No. 2020-136260, the insulating layer with the inclined portion is arranged to cover the end portion of the flat lower electrode. Furthermore, the current leak between the adjacent elements and the current leak between the upper electrode and the lower electrode are suppressed by adjusting the thickness of the organic layer arranged on the inclined portion of the insulating layer. In the case of just adjusting the thickness of the organic layer as in the related art, however, there arises a disadvantage that the current leak between the adjacent elements cannot be sufficiently suppressed.

SUMMARY OF THE INVENTION

In consideration of the above-described situation, the present disclosure intends to provide an electronic device capable of more reliably suppressing the current leak between the adjacent elements.

The present disclosure provides an electronic device including elements arranged on a substrate, each of the elements including an insulating layer, a first electrode, a functional layer, and a second electrode in mentioned order starting from a side closer to the substrate, the functional layer and the second electrode being continuously arranged to cover two of the first electrodes independently included in adjacent two of the elements from a position on one of the two first electrodes to a position on the other first electrode, wherein the insulating layer has an inclined portion that is inclined relative to the substrate, the first electrode has a first portion positioned on the inclined portion and a second portion in contact with the functional layer, the second portion having a smaller inclination angle relative to the substrate than the first portion, and a thickness of the functional layer positioned on the first portion in a direction normal to a functional layer surface in contact with the first portion is smaller than a thickness of the functional layer positioned on the second portion in a direction normal to a functional layer surface in contact with the second portion.

Further features of the present disclosure will become apparent from the following description of exemplary embodiments with reference to the attached drawings.

DESCRIPTION OF THE EMBODIMENTS

Details of organic light emitting apparatuses according to embodiments of the present disclosure will be described below with reference to the drawings. Any of the following embodiments represents an example of the present disclosure, and numerical values, shapes, materials, components, and arrangements and connection forms of the components in the embodiments are not purported to limit the scope of the invention. Although various features are mentioned in the embodiments, all those features are not always essential in the present disclosure, and those features may be optionally combined with each other. In the attached drawings, the same or similar components are denoted by the same reference numbers, and duplicate description of those components is omitted.

In this disclosure, words, such as "upper" and "lower", indicating arranged positions are used for convenience in explaining a positional relation between the components with reference to the drawings. The positional relation between the components changes case by case depending on a direction looking at the components. Accordingly, expressions indicating the positional relation are not limited to the words used in this disclosure and can be replaced with other ones as appropriate depending on situations. Furthermore, the words "upper" and "lower" are each not to be interpreted as implying a state in which one component is positioned right above or under the other component and both the components are in direct contact with each other. For example, an expression "an electrode B on an insulating layer A" does not require the electrode B to be formed on the insulating layer A in direct contact with the insulating layer A and does not exclude the case in which another component is present between the insulating layer A and the electrode B.

In this disclosure, an expression "substantially parallel" implies a state in which two straight lines or two planes are arranged at an angle of −15° or more and 150 or less formed therebetween. In this disclosure, an expression "continuously arranged between A and B" implies that the relevant component is continuously arranged from A to B without interruption. In this disclosure, a word "height" indicates a distance measured from an upper surface (first surface) of a substrate 1 upward. A portion parallel to the upper surface (first surface) of the substrate 1 may be designated, and the "height" may be specified on the basis of the designated reference.

First Embodiment

An organic light emitting apparatus according to a first embodiment of the present disclosure will be described below with reference to FIGS. 1 to 7. The first embodiment represents an example in which an electronic device is implemented as an organic light emitting apparatus.

Overall Configuration of Organic Light Emitting Apparatus

Figure 1:
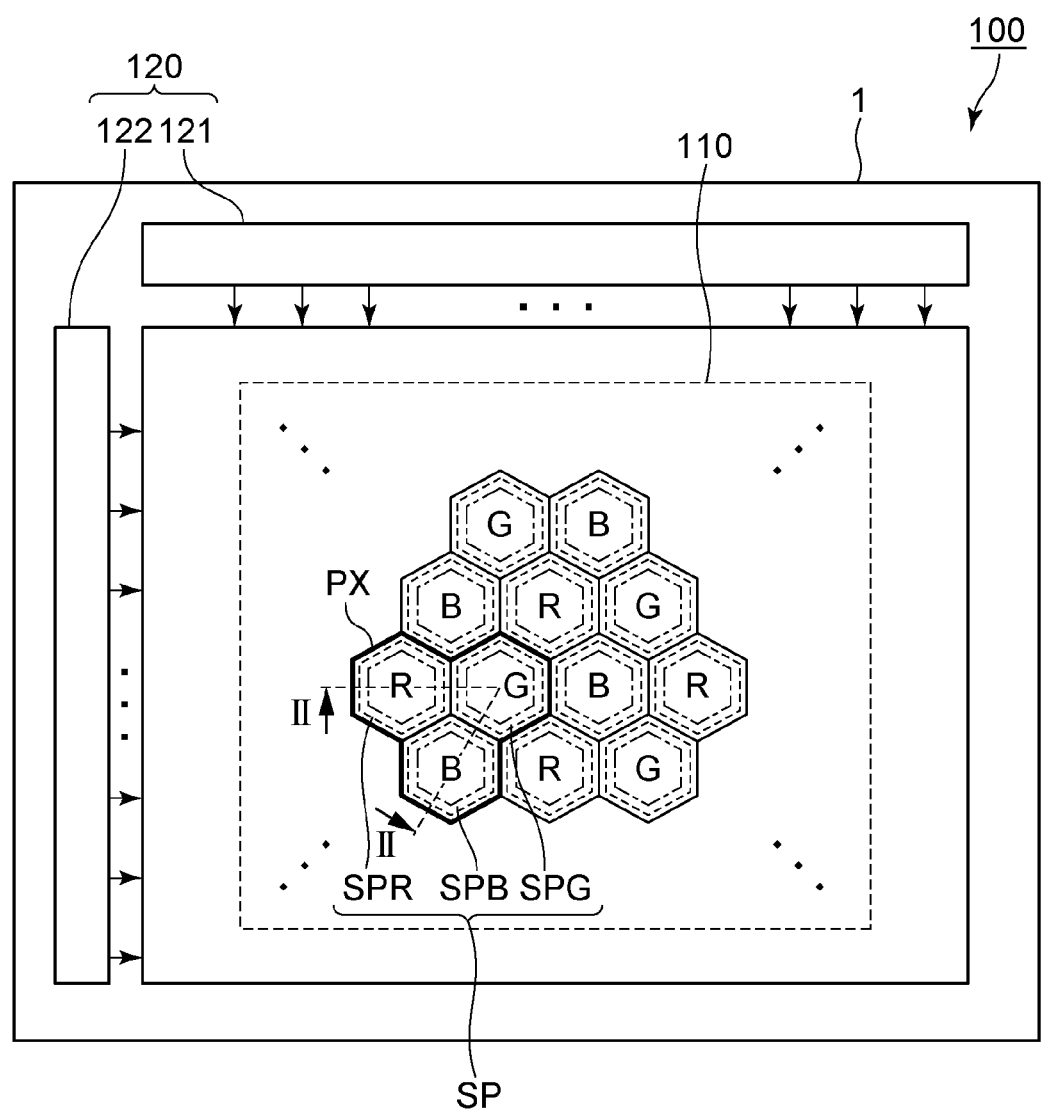
FIG. 1 is a plan view illustrating a configuration of an organic light emitting apparatus according to a first embodiment.

FIG. 1 is a plan view illustrating a configuration of the organic light emitting apparatus 100 according to the first embodiment. The organic light emitting apparatus 100 includes a display region 110 where multiple pixels PX are arranged on a substrate 1 (on a substrate) in a two-dimensional array, and a peripheral circuit 120. The peripheral circuit 120 is a circuit for displaying an image in the display region 110 and may include a signal line drive circuit 121 (signal output circuit) and a signal line drive circuit 122 (vertical scan circuit) which are drivers for displaying the image.

Each of the pixels PX includes multiple sub-pixels SP. In this embodiment, each of the pixels PX includes three kinds of sub-pixels SP, namely a first sub-pixel SPR emitting light of a first color, a second sub-pixel SPG emitting light of a second color, and a third sub-pixel SPB emitting light of a third color. Here, the first color, the second color, and the third color are assumed to be, for example, red, green, and blue, respectively. The configuration of the pixel PX described above is an example, and the pixel configuration is not limited to the above-described one. In another example, each of the pixels PX may include a fourth sub-pixel SPW emitting light of a fourth color in addition to the first sub-pixel SPR, the second sub-pixel SPG, and the third sub-pixel SPB. The fourth color may be, for example, white or yellow. Moreover, this embodiment represents an example in which the sub-pixels SP are arranged in a delta array, but the present disclosure is not limited to such an example. The sub-pixels may be arranged in a stripe array, a square array, or a Bayer array.

Configuration of Light Emitting Element

Figure 2:
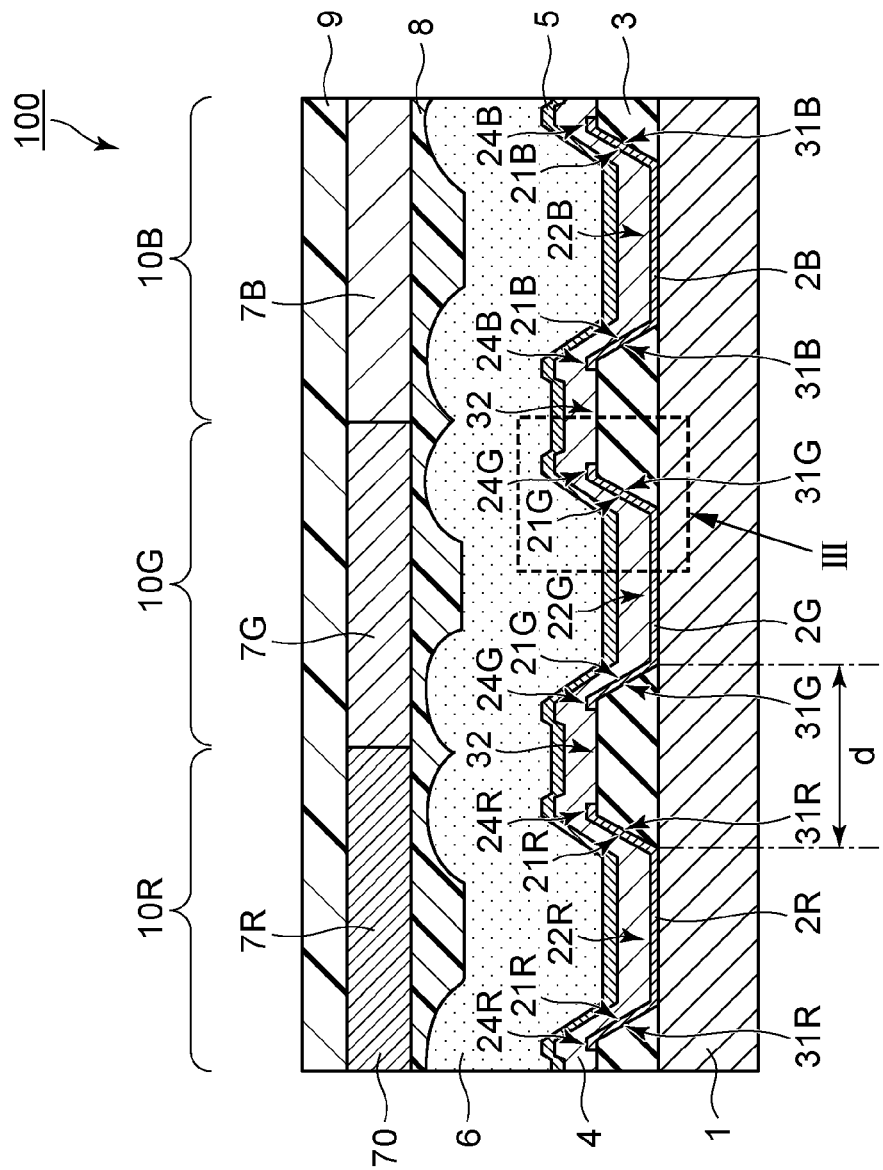
FIG. 2 is a sectional view illustrating the configuration of the organic light emitting apparatus according to the first embodiment.

FIG. 2 is a schematic sectional view taken along a line segment II-II in FIG. 1. Each of the sub-pixels SP includes a light emitting element 10 arranged on the upper surface (first surface) of the substrate 1. FIG. 2 illustrates the three sub-pixels SP belonging to one of the pixels PX that are included in the organic light emitting apparatus 100. The first sub-pixel SPR includes a first light emitting element 10R, the second sub-pixel SPG includes a second light emitting element 10G, and the third sub-pixel SPB includes a third light emitting element 10B. The first light emitting element 10R is a light emitting element configured to emit the light of the first color, the second light emitting element 10G is a light emitting element configured to emit the light of the second color, and the third light emitting element 10B is a light emitting element configured to emit the light of the third color. In this disclosure, when particular one of the light emitting elements 10 is referred to, the relevant light emitting element is denoted by adding a suffix to the reference number like the light emitting element "10R". When the light emitting element is referred to without specifying the kind of the light emitting element, the light emitting element is denoted simply by the light emitting element "10". The above point is similarly applied to the other components.

Each of the light emitting elements 10 includes a first insulating layer 3, a lower electrode 2 also called a first electrode, an organic layer 4 including a light emitting layer, and an upper electrode 5 also called a second electrode, which are laminated in the mentioned order starting from an upper surface side of the substrate 1 (from a side closer to the substrate). The organic layer 4 including the light emitting layer can also be called a functional layer. The organic light emitting apparatus 100 according to this embodiment is a top emission device in which light is taken out from the upper electrode 5. The organic light emitting apparatus 100 further includes a protective layer 6 arranged to cover the upper electrode 5, a first planarization layer 8, a second planarization layer 9, and a color filter layer 70.

The color filter layer 70 includes a first color filter 7R, a second color filter 7G, and a third color filter 7B. The first color filter 7R is a color filter allowing the light of the first color to pass therethrough, the second color filter 7G is a color filter allowing the light of the second color to pass therethrough, and the third color filter 7B is a color filter allowing the light of the third color to pass therethrough. Those color filters 7 are disposed in a one-to-one relation to the light emitting elements 10 and are arranged corresponding to the light emitting regions of the light emitting elements 10, respectively. In the plan view of FIG. 1, the color filter 7 included in each sub-pixel SP (light emitting element 10) is denoted by a solid line. Furthermore, in FIG. 1, an outer edge of the lower electrode 2 included in each sub-pixel SP is denoted by a dotted line, and an opening in the first insulating layer 3 is denoted by a one-dot-chain line. As described later, the organic layer 4 is in contact with the lower electrode 2, and a region where the organic layer 4 and the lower electrode 2 are in contact with each other serves as the light emitting region of each sub-pixel SP. In this embodiment, because an entire upper surface of the lower electrode 2 is in contact with the organic layer 4, the light emitting region of each sub-pixel SP is given by a region denoted by the dotted line in FIG. 1. As illustrated in FIG. 1, each color filter 7 is arranged to lie over a center of the light emitting region of the corresponding light emitting element 10 in the plan view.

In this embodiment, the organic layer 4 included in each light emitting element 10 emits white light. Each of the color filters 7R, 7G and 7B separates one of RGB lights from the white light emitted from the organic layer 4 by allowing the relevant light to selectively pass therethrough, and then outputs the separated light to the outside. At least part of the color filters included in the color filter layer 70 may be a color conversion layer that absorbs the light emitted from the organic layer and outputs light after conversion to another color. The color conversion layer may contain a quantum dot (QD). The color filter layer 70 may include four or more kinds of color filters. In addition, the light emitted from the organic layer 4 may not need to be the white light.

The substrate 1 is a plate member with the first surface. The various components are laminated on the first surface of the substrate 1, whereby the organic light emitting apparatus 100 is formed. The substrate 1 may be a semiconductor substrate such as a silicon substrate, or an insulator substrate made of, for example, glass, quartz, or resin. Furthermore, the substrate 1 may have flexibility.

A drive circuit layer (not illustrated) including transistors electrically connected to the lower electrode 2 may be formed on the substrate 1. In this embodiment, a drive circuit formed in the drive circuit layer is a pixel drive circuit of the active-matrix type. Hence it can be said that the organic light emitting apparatus 100 is an active-matrix display apparatus. The drive circuit layer may be formed by being laminated on the substrate 1, or part of the drive circuit layer may be formed directly in the substrate 1 by a semiconductor process. The drive circuit layer may include transistors, wiring layers, and an insulator positioned between the wiring layers. The insulator is, for example, an interlayer insulating layer made of an inorganic material such as silicon oxide (SiOx), silicon nitride (SiNx), or silicon oxynitride (SiON), or made of an organic material such as polyimide or polyacrylate. The interlayer insulating layer has a planar upper surface and is often called a planarization layer from the purpose of reducing unevenness of a surface that serves as an underground in a step of forming the lower electrode 2. When the substrate 1 includes the drive circuit layer, the term "substrate" may be regarded as including the drive circuit layer as well. When the term "substrate" is regarded as including the drive circuit layer as well, an upper surface of the uppermost interlayer insulating layer in the drive circuit layer can be regarded as the first surface. In this embodiment, because the lower electrode 2 is formed on the first surface, part of a lower surface of the lower electrode 2, the part being in contact with the substrate 1, coincides with the first surface. Accordingly, the part of the lower surface of the lower electrode 2 in contact with the substrate 1 may be regarded as the first surface.

The first insulating layer 3 is arranged on the substrate 1. The first insulating layer 3 is positioned between one sub-pixel SP and another sub-pixel SP adjacent to the former, and each sub-pixel SP is defined by the first insulating layer 3. Furthermore, the first insulating layer 3 has an inclined portion 31 that is inclined relative to the first surface of the substrate 1. The insulating layer 3 is also called a pixel separation film, a partition, or a bank.

As illustrated in FIG. 2, the first insulating layer 3 positioned between the first sub-pixel SPR and the second sub-pixel SPG has an inclined portion 31R in an end portion thereof on a side closer to the first sub-pixel SPR and an inclined portion 31G in an end portion thereof on a side closer to the second sub-pixel SPG. Similarly, the first insulating layer 3 positioned between the second sub-pixel SPG and the third sub-pixel SPB has another inclined portion 31G in an end portion thereof on a side closer to the second sub-pixel SPG and an inclined portion 31B in an end portion thereof on a side closer to the third sub-pixel SPB. Furthermore, although not illustrated in FIG. 2, the first insulating layer 3 positioned between the third sub-pixel SPB and the first sub-pixel SPR has another inclined portion 31B in an end portion thereof on a side closer to the third sub-pixel SPB and another inclined portion 31R in an end portion thereof on a side closer to the first sub-pixel SPR. In addition, the first insulating layer 3 has a flat portion 32 between the two inclined portions 31. The first sub-pixel SPR, the second sub-pixel SPG, and the third sub-pixel SPB may be read as the first light emitting element 10R, the second light emitting element 10G, and the third light emitting element 10B, respectively.

The first insulating layer 3 may be formed by, for example, a chemical vapor deposition (CVD) method or a physical vapor deposition (PVD) method. The first insulating layer 3 may be made of, for example, silicon nitride (SiNx), silicon oxide (SiOx), or silicon oxynitride (SiON). The first insulating layer 3 may be formed of a layered film of the above-mentioned materials. An inclination angle of the inclined portion 31 of the first insulating layer 3 can be controlled depending on conditions of anisotropic etching or isotropic etching. Alternatively, the inclination angle of the inclined portion 31 of the first insulating layer 3 may be controlled by controlling an inclination angle of a layer that is positioned under the first insulating layer 3. An upper surface of the first insulating layer 3 may have unevenness that is produced by processing such as etching, or by laminating an additional layer.

The lower electrode 2 is an anode (positive electrode) and is arranged to be electrically separated for each light emitting element 10. In other words, the lower electrode 2 is arranged to be electrically separated per sub-pixel. It can also be said that the light emitting elements 10 independently include the lower electrodes 2 in a one-to-one relation. The lower electrode 2 is also called a pixel electrode or an individual electrode. In this embodiment, the lower electrode 2 functions as not only the anode, but also a reflecting layer that reflects the light generated from the organic layer 4 and increases emission efficiency of the light emitting element 10. To enhance the function as the reflecting layer, the lower electrode 2 may be made of a metal material with a reflectance of 80% or more for a light emission wavelength of the organic layer 4. Here, the light emission wavelength of the organic layer 4 is a wavelength of the light emitted from the organic layer 4 at which light intensity is maximum. For example, a metal such as Al (aluminum) or Ag (silver), or an alloy obtained by adding, for example, Si, Cu, Ni or Nd to any of the above-mentioned metals can be used as a material of the lower electrode 2. Alternatively, a metal material with a reflectance of 80% or more for light in a visible light range may be used as the material of the lower electrode 2. The lower electrode 2 may have a layered structure including a barrier layer. A metal such as Ti, W, Mo or Au, or an alloy of any of those metals may be used as a material of the barrier layer. The barrier layer may be a metal layer positioned on the upper surface of the lower electrode 2.

The lower electrode 2 has a first portion 21 arranged on the inclined portion 31 of the first insulating layer 3, and a second portion 22 arranged on the substrate 1 in contact with the substrate 1. The lower electrode 2 further has a fourth portion 24 arranged on the flat portion 32 of the first insulating layer 3. The lower electrode 2 is arranged to follow the shape of a layer positioned right below. Therefore, an upper surface and a lower surface of the first portion 21 positioned on the inclined portion 31 are inclined relative to the first surface of the substrate 1 like the inclined portion 31. On the other hand, an upper surface and a lower surface of the second portion 22 positioned on the substrate 1 are substantially parallel to the first surface of the substrate 1. The second portion 22 can also be said as a portion of which surface (upper surface) on an opposite side to the substrate 1 has a smaller inclination angle relative to the substrate 1 than the upper surface of the first portion 21. Furthermore, the upper surface of the flat portion 32 is substantially parallel to the first surface of the substrate 1. Therefore, an upper surface and a lower surface of the fourth portion 24 positioned on the flat portion 32 are substantially parallel to the first surface of the substrate 1. The fourth portion 24 can also be said as a portion of which surface (upper surface) on an opposite side to the substrate 1 has a smaller inclination angle relative to the substrate 1 than the upper surface of the first portion 21. Moreover, the first portion 21 can also be said as being arranged to surround the second portion 22 in the plan view. The fourth portion 24 can be further said as being arranged to surround the first portion 21 in the plan view.

The organic layer 4 is positioned between the lower electrode 2 and the upper electrode 5. The organic layer 4 is continuously arranged on both the lower electrode 2 and the first insulating layer 3 in common to the multiple light emitting elements 10. It can also be said that the multiple light emitting elements 10 share the single organic layer 4. The organic layer 4 may be arranged in common to the multiple sub-pixels SP constituting one pixel PX. The organic layer 4 may be separated between the adjacent pixels PX or may be arranged in common to the multiple pixels PX. The organic layer 4 may be integrally formed over the entirety of the display region 110 where the organic light emitting apparatus 100 displays an image. When the organic layer 4 is constituted by multiple layers, at least part of the layers may be continuously arranged over the multiple light emitting elements 10. When the sub-pixel SP has a very small size, it is particularly effective to arrange the organic layer 4 in common to the multiple sub-pixels SP.

Assume now that each of the pixels PX included in the organic light emitting apparatus 100 includes the first sub-pixel SPR with a first lower electrode 2R and the second sub-pixel SPG with a second lower electrode 2G. In such a case, at least part of the organic layer 4 may be continuously arranged between a position on the first lower electrode 2R and a position on the second lower electrode 2G. Here, the expression "continuously arranged" implies that the organic layer is continuously arranged without interruption at the intermediate. Furthermore, the expression "continuously arranged between a position on the first lower electrode 2R and a position on the second lower electrode 2G" implies that the organic layer 4 is continuously arranged from the position on the first lower electrode 2R to the position on the second lower electrode 2G without interruption.

Assume further that each of the pixels PX included in the organic light emitting apparatus 100 includes the first sub-pixel SPR with the first lower electrode 2R, the second sub-pixel SPG with the second lower electrode 2G, and the third sub-pixel SPB with a third lower electrode 2B. In such a case, at least part of the organic layer 4 may satisfy the following point. The organic layer 4 may be continuously arranged in at least two of regions between the position on the first lower electrode 2R and the position on the second lower electrode 2G, between the position on the second lower electrode 2G and a position on the third lower electrode 2B, and between the position on the third lower electrode 2B and the position on the first lower electrode 2R. Alternatively, the organic layer 4 may be continuously arranged in all the regions between the position on the first lower electrode 2R and the position on the second lower electrode 2G, between the position on the second lower electrode 2G and the position on the third lower electrode 2B, and between the position on the third lower electrode 2B and the position on the first lower electrode 2R.

The organic layer 4 includes the light emitting layer configured to emit light with recombination of holes supplied from the lower electrode 2 and electrons supplied from the upper electrode 5. The organic layer 4 may include a hole transport layer, the light emitting layer, and an electron transport layer. For the organic layer 4, an appropriate material can be selected from the viewpoint of emission efficiency, a drive lifetime, and optical interference. The hole transport layer may function as an electron blocking layer or a hole injection layer, or may be formed in a layered structure of, for example, the hole injection layer, the hole transport layer, and the electron blocking layer. The light emitting layer may be formed in a layered structure of light emitting layers configured to emit lights of different colors or may be a mixture layer prepared by mixing light emitting dopants that emit lights of different colors. The light emitting layer may contain a first-color light emitting material that emits the light of the first color, a second-color light emitting material that emits the light of the second color, and a third-color light emitting material that emits the light of the third color. The light emitting layer may be configured to produce white light with mixing of individual emission colors. The first color, the second color, and the third color may be, for example, red, green, and blue, respectively. The light emitting layer may contain light emitting materials in a complementary color relation, such as a blue light emitting material and a yellow light emitting material. The electron transport layer may function as a hole blocking layer or an electron injection layer, or may be formed in a layered structure of, for example, the electron injection layer, the electron transport layer, and the hole blocking layer.

The organic layer 4 may include multiple light emitting layers and an intermediate layer positioned between the functional layers. The organic light emitting apparatus 100 may be a light emitting apparatus of a tandem structure in which the intermediate layer serves as a charge generating layer. The tandem structure may include a charge transport layer, such as a hole transport layer or an electron transport layer, between the charge generating layer and the light emitting layer.

The charge generating layer is a layer that includes an electron donating material and an electron accepting material, and that generates charges. The electron donating material and the electron accepting material are, respectively, a material that donates electrons and a material that accepts those electrons. Thus, because positive and negative charges are generated in the charge generating layer, the positive or negative charges can be supplied to layers positioned above and under the charge generating layer. The electron donating material may be, for example, an alkali metal such as lithium or cesium. As an alternative, the electron donating material may be, for example, lithium fluoride, a lithium complex, cesium carbonate, or a cesium complex. In the latter case, an electron donating ability may be developed by mixing a reducing material, such as aluminum, magnesium, or calcium, together. The electron accepting material may be, for example, an inorganic material such as molybdenum oxide, or an organic material such as [dipyrazino[2,3-f:2',3'-h]quinoxaline-2,3,6,7,10,11-hexacarbonitrile] (HAT-CN). The electron accepting material and the electron donating material may be mixed with each other or laminated one above the other.

The upper electrode 5 is a cathode (negative electrode) and is arranged on the organic layer 4. The upper electrode 5 is continuously formed over the multiple light emitting elements 10 and is shared by those light emitting elements 10. Like the organic layer 4, the upper electrode 5 may be integrally formed over the entirety of the display region 110 where the organic light emitting apparatus 100 displays an image. The upper electrode 5 may be an electrode transmitting at least part of light that has reached a lower surface of the upper electrode 5. The upper electrode 5 may function as a transflective layer with a property of transmitting part of light and reflecting the other part of the light (namely, a transflective property). The upper electrode 5 may be made of, for example, a metal such as magnesium or silver, an alloy containing magnesium or silver as a main ingredient, or an alloy material containing an alkali metal or an alkali earth metal. Alternatively, an oxide conductor, such as ITO, IZO, ZnO, AZO, or IGZO, may be used as the upper electrode 5. The upper electrode 5 may be formed in a layered structure insofar as an appropriate transmittance is obtained.

The protective layer 6 is continuously formed on the upper electrode 5 over the multiple light emitting elements 10 and is shared by those light emitting elements 10. The protective layer 6 may contain an inorganic material with light transparency and low permeability for oxygen and moisture incoming from the outside. The protective layer 6 is also called, for example, a moisture-proof layer or a sealing layer. The protective layer 6 may contain, for example, silicon nitride (SiNx), silicon oxynitride (such as SiON), aluminum oxide (such as $Al_2O_3$), silicon oxide (SiOx), or titanium oxide (such as $TiO_2$). The silicon nitride and the silicon oxynitride may be formed by, for example, a CVD method or a sputtering method. On the other hand, the aluminum oxide, the silicon oxide, and the titanium oxide may be formed by an atom layer deposition (ALD) method. Combinations of materials and manufacturing methods for the protective layer 6 are not limited to the above-mentioned examples, and the protective layer 6 may be manufactured in consideration of the thickness of a layer to be formed, the time required to form the protective layer, and so on. The protective layer 6 may be formed in a single-layer structure or a layered structure insofar as transmitting the light having passed through the upper electrode 5 and ensuring sufficient moisture barrier performance.

The color filter layer 70 is formed on the protective layer 6. As described above, the color filter layer 70 may include the first color filter 7R, the second color filter 7G, and the third color filter 7B. Like the first color filter 7R and the second color filter 7G illustrated in FIG. 2, the color filters 7 included in the color filter layer 70 may be in contact with each other without a gap therebetween. Furthermore, an end portion of the color filter 7 for one color may be arranged to overlap an end portion of the color filter 7 for another color.

The first planarization layer 8 is formed between the protective layer 6 and the color filter layer 70, and the second planarization layer 9 is formed on the color filter layer 70. The first and second planarization layers 8 and 9 are made of, for example, resin.

Configurations of Layers Arranged on Inclined Portion of First Insulating Layer

Configurations of layers arranged on the inclined portion 31 of the first insulating layer 3 will be described below.

In the organic light emitting apparatus 100 according to this embodiment, as illustrated in FIG. 2, the first insulating layer 3 has the inclined portion 31, and the lower electrode 2, the organic layer 4, and the upper electrode 5 are laminated on the inclined portion 31. A layer thickness of a portion of the organic layer 4, the portion being positioned on the first portion 21 of the lower electrode 2, is thinner than that of another portion of the organic layer 4, the other portion being positioned on the second portion 22 of the lower electrode 2. Here, in this disclosure, a "layer thickness" of a layer A indicates a thickness of the layer A in a normal direction relative to an upper surface of a layer B serving as an underground for the layer A (namely relative to a surface of the layer B in contact with the layer A). Thus, the layer thickness of the portion of the organic layer 4, positioned on the first portion 21 of the lower electrode 2, can be said as a thickness in a normal direction relative to an upper surface of the first portion 21. Furthermore, the layer thickness of the portion of the organic layer 4, positioned on the second portion 22 of the lower electrode 2, can be said as a thickness in a normal direction relative to an upper surface of the second portion 22.

Under the above-described condition, a resistance of the portion of the organic layer 4, positioned on the first portion 21, in a direction of the layer thickness thereof can be made smaller than that of the portion of the organic layer 4, positioned on the second portion 22, in a direction of the layer thickness thereof. Accordingly, even if the charges injected from the lower electrode 2 flows laterally, namely toward the adjacent sub-pixel SP, those charges can be subjected to the charge recombination in the relatively thin portion of the organic layer 4 on the first portion 21 before reaching the adjacent sub-pixel SP. As a result, a charge crosstalk between the sub-pixels SP can be suppressed, and a current leak between the sub-pixels SP can be suppressed.

Furthermore, in this embodiment, the organic layer 4 positioned on the inclined portion 31 and being relatively thin is sandwiched between the lower electrode 2 and the upper electrode 5. Therefore, during a period in which the organic light emitting apparatus 100 is driven and the light emitting element 10 constituting the sub-pixel SP is caused to emit light, an electric field is applied between the lower electrode 2 and the upper electrode 5. Accordingly, the charge recombination can be made more easily occur in the organic layer 4 on the inclined portion 31 than in the case in which the organic layer 4 is arranged in a smaller thickness on the inclined portion 31 without disposing the lower electrode 2. As a result, the current leak between the sub-pixels SP can be further suppressed.

Figure 3:
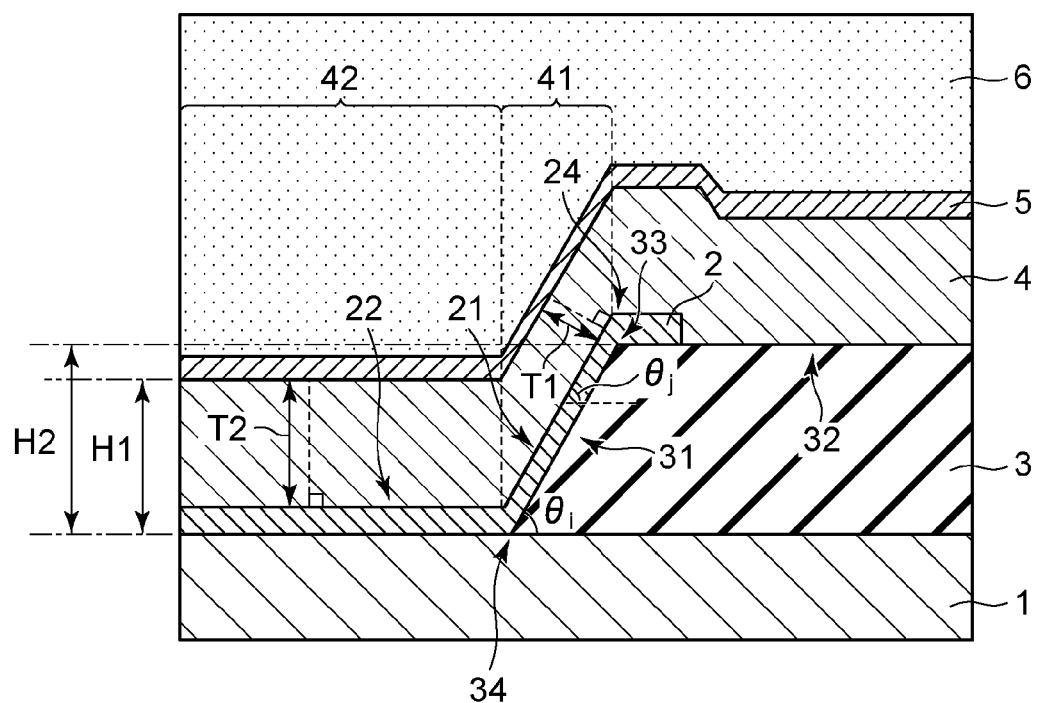
FIG. 3 is a partial enlarged view of FIG. 2.

FIG. 3 is an enlarged view of an area III denoted by a dotted line in FIG. 2. As described above, the lower electrode 2 has the first portion 21 positioned on the inclined portion 31, the second portion 22 in contact with the substrate 1, and the fourth portion 24 positioned on the flat portion 32. Moreover, the organic layer 4 is arranged to cover the lower electrode 2 and the first insulating layer 3, and it has a first region 41 positioned on the first portion 21 and being relatively thin, and a second region 42 positioned on the second portion 22. Because the first region 41 is inclined relative to the first surface of the substrate 1 like both the inclined portion 31 and the first portion 21 on an underlying side, the first region 41 can also be called an inclined region of the organic layer 4. Because an upper surface and a lower surface of the second region 42 are substantially parallel to the first surface of the substrate 1 like the second portion 22 on an underlying side, the second region 42 can also be called a flat region of the organic layer 4.

When each sub-pixel SP in the organic light emitting apparatus 100 has a structure in the plan view as illustrated in FIG. 1, the inclined portion 31 is formed along a peripheral edge portion of the lower electrode 2 to extend around all six sides of a hexagon. In other words, the inclined portion 31 is arranged to surround the second portion 22 of the lower electrode 2 in contact with the organic layer 4.

Although the first region 41 of the organic layer 4 is a portion of the organic layer 4, the portion being positioned on the first portion 21 and being relatively thin, the organic layer 4 further has, at both ends of the first region 41, portions in each of which the layer thickness is not relatively thin, as illustrated in FIG. 3. Stated in another, although the layer thickness of the organic layer 4 is relatively thin in a portion of the first region 41 in which the lower electrode 2 and the upper electrode 5 are positioned to face each other in parallel, the layer thickness is not relatively thin in other portions than the above-mentioned portion. In an end portion of the first region 41 adjacent to the second region 42, because the first region 41 is partly filled with the second region 42 having the greater thickness, the layer thickness is increased. This is similarly applied to the other end portion of the first region 41 on a side opposite to the second region 42. Accordingly, the layer thickness in the first region 41 is preferably measured in its portion in which the lower electrode 2 and the upper electrode 5 are positioned to face each other in parallel. Similarly, the layer thickness in the second region 42 is preferably measured in its portion in which the lower electrode 2 and the upper electrode 5 are positioned to face each other in parallel. In this embodiment, as illustrated in FIG. 3, a layer thickness T1 in the first region 41 is smaller than a layer thickness T2 in the second region 42.

Furthermore, as illustrated in FIG. 3, a height H1 of an upper surface of the organic layer 4 in the second region 42 is preferably lower than a height H2 of an upper end 33 of the inclined portion 31. Under such a condition, it is ensured that the organic layer 4 formed on the lower electrode 2 does not entirely fills the organic layer 4 formed along the inclined portion 31. Therefore, when the organic layer 4 is arranged on the lower electrode 2 and the first insulating layer 3, the layer thickness in the first region 41 of the organic layer 4 arranged on the inclined portion 31 is easier to reduce. Hence the current leak between the sub-pixels SP can be more easily suppressed.

Interval Between Main Light Emitting Regions and Layer Thickness in First Region In the organic light emitting apparatus 100, as described above, the lower electrode 2 is arranged for each of the sub-pixels SP. Assume here that, as illustrated in FIG. 2, a shortest distance between the second portion 22 of one lower electrode 2 and the second portion 22 of another lower electrode 2 adjacent to the former is denoted by d. The distance d can also be said as a shortest distance between adjacent two of the second regions 42.

In the organic light emitting apparatus 100, a ratio (d/T2) of the distance d between the second portions 22 of the two adjacent lower electrodes 2 to the layer thickness T2 of the organic layer 4 on the second portion 22 of the lower electrode 2 (namely, in the second region 42) may be less than 50. Here, of the light emitting region of each sub-pixel SP, the portion of the organic layer 4 positioned on the second portion 22 of the lower electrode 2 (namely, the second region 42) most greatly contributes to light emission and hence can be said as a main light emitting region. A smaller value of the ratio (d/T2) of the distance d to the layer thickness T2 implies that the interval between the main light emitting regions of the organic layer 4 is smaller, and that the light emitting elements 10 constituting the sub-pixels SP are arranged at a higher density. In related-art electronic devices such as an organic light emitting apparatus, the current leak between the sub-pixels SP has caused a significantly serious problem when the ratio (d/T2) of the distance d to the layer thickness T2 is less than 50. The reason of causing such a problem will be described below.

Figure 4:
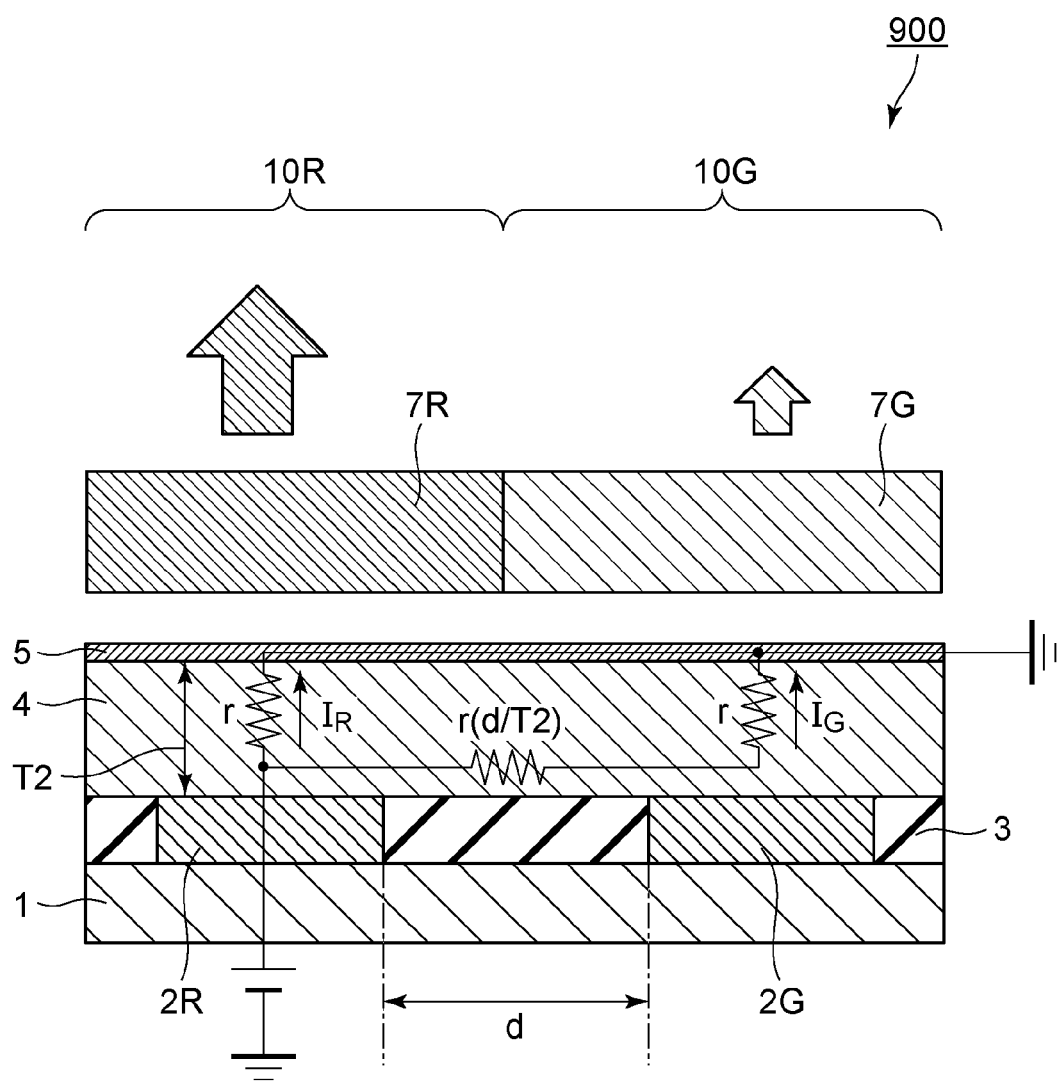
FIG. 4 is a schematic view illustrating a configuration of an organic light emitting apparatus as a comparative example.

FIG. 4 is a schematic view illustrating a configuration of an organic light emitting apparatus 900 as a comparative example. The organic light emitting apparatus 900 is different from the organic light emitting apparatus 100 in that the organic light emitting apparatus 900 has neither the inclined portion 31 of the first insulating layer 3 nor the first portion 21 of the lower electrode 2 positioned on the inclined portion 31. In other words, the organic light emitting apparatus 900 can be said as not having the current leak suppression structure included in the organic light emitting apparatus 100 according to this embodiment. FIG. 4 further illustrates an equivalent circuit of a light emitting element 10R in a superimposed relation. The equivalent circuit schematically illustrates a resistance value of an organic layer 4 in FIG. 4 and does not imply that an electronic circuit is incorporated in the light emitting element. An equivalent circuit of a light emitting element 10G is also illustrated in FIG. 4 to explain a current leak between the light emitting elements 10. The light emitting element 10R included in the organic light emitting apparatus 900 is a light emitting element configured to emit red light, and the light emitting element 10G is a light emitting element configured to emit green light.

Assume that a layer thickness of the organic layer 4 on the lower electrode 2R is denoted by T2, a distance between openings where the lower electrode 2R and the lower electrode 2G are formed is denoted by d, and a resistance of the organic layer 4 per unit area in a direction of thickness thereof is denoted by r. In this comparative example, the lower electrode 2 is constituted only by a flat portion formed on a flat substrate 1. Therefore, it can also be said that the entirety of the lower electrode 2 provides the second portion 22 in the above-described embodiment. Accordingly, the distance between the openings where the lower electrode 2R and the lower electrode 2G are formed can also be said as the distance between the second portions 22 of the two adjacent lower electrodes 2.

On the above assumption, a resistance of the organic layer 4 per unit area in a horizontal direction is given by r(d/T2). Assuming a current flowing between the lower electrode 2 and the upper electrode 5 in the light emitting element 10R to be $I_R$ and a current flowing between the lower electrode 2 and the upper electrode 5 in the light emitting element 10G to be $I_G$, the following relation is held.

$$I_G/I_R = 1/(1 + d/T2) \quad (1)$$

The formula (1) implies that, even trying to cause only the light emitting element 10R to emit light, the current flows through the light emitting element 10G as well and the light emitting element 10G also emits light. The formula (1) further implies that a magnitude of the current flowing through the adjacent light emitting element 10G depends on d/T2 and the current more easily flows through the adjacent light emitting element 10G as d/T2 takes a smaller value.

Assume that an emission spectrum obtained only with the light emitting element 10R when the light is emitted at the same current amount is denoted by $S_R$, and that an emission spectrum obtained only with the light emitting element 10G is denoted by $S_G$. In this case, an emission spectrum $S_{R+G}$ in consideration of the leak current between the light emitting elements 10 is expressed by the following formula (2).

$$S_{R+G} = S_R + S_G(I_G/I_R) \quad (2)$$

Figure 5:
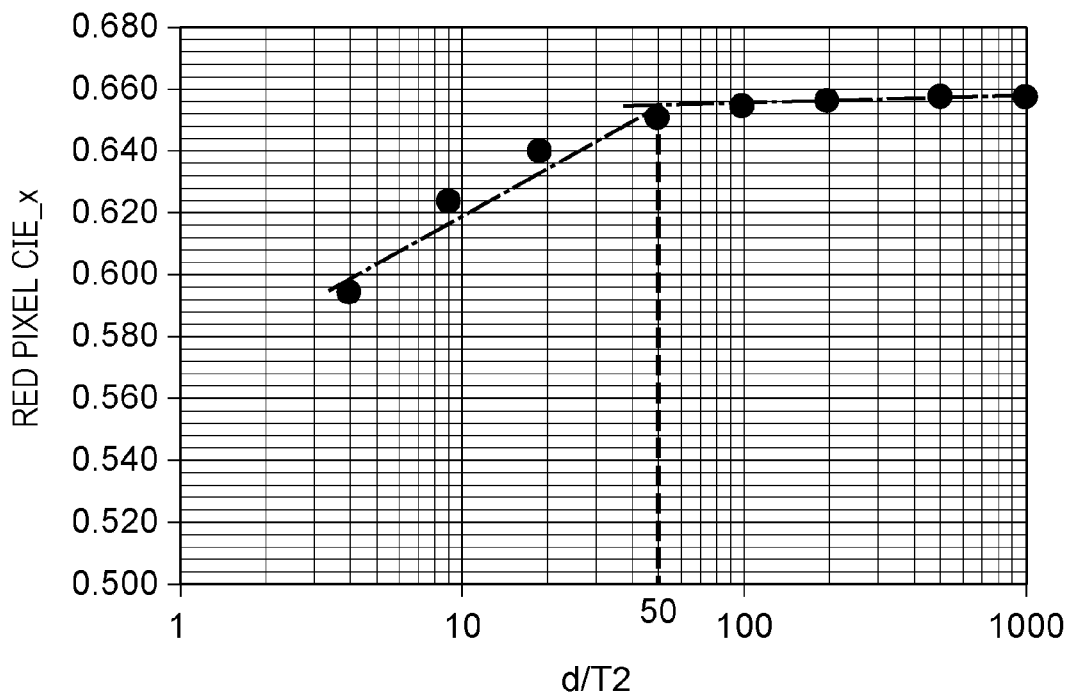
FIG. 5 is a graph depicting a relation between a ratio of a distance between flat portions of two adjacent lower electrodes to a layer thickness of an organic layer on the lower electrode and chromaticity of a red pixel.

FIG. 5 depicts a graph obtained by calculating chromaticity coordinates of $S_{R+G}$ in the CIExy space, and by plotting an x-coordinate value (CIE_x) of the chromaticity coordinates on a vertical axis and a value of d/T2 on a horizontal axis. Thus, FIG. 5 represents a relation between d/T2 and the x-value of the chromaticity coordinates. A change in the x-coordinate value of the chromaticity coordinates in FIG. 5 implies that green light is also emitted despite the intention to emit red light. Hence a smaller x-coordinate value in FIG. 5 implies that the leak current to the adjacent pixel is generated.

As depicted in FIG. 5, when d/T2 is 50 or more, the x-coordinate value is kept high and is hardly changed. On the other hand, when d/T2 is less than 50, the x-coordinate value is remarkably reduced, and a reduction in color purity of the red light is significant. Thus, it is understood that when the ratio (d/T2) of the distance d to the layer thickness T2 is less than 50, the current leak between the sub-pixels SP causes a significantly serious problem.

In contrast, in the embodiment, the current leak suppression structure of suppressing the current leak between the sub-pixels SP is realized by forming the inclined portion 31 of the first insulating layer 3 and the first portion 21 of the lower electrode 2 positioned on the inclined portion 31. With such a configuration, even when the ratio (d/T2) of the distance d to the layer thickness T2 is less than 50 and the current leak between the sub-pixels SP is relatively likely to generate, the current leak can be suppressed.

Inclination Angle of Inclined Portion of Insulating Layer

Assume, as illustrated in FIG. 3, an inclination angle of the inclined portion 31 to be $\theta_i$ and an inclination angle of the upper surface of the first portion 21 of the lower electrode 2 to be $\theta_j$. Here, $\theta_j$ can also be said as an inclination angle of an upper surface of a layer serving as an underground on which the organic layer 4 is to be formed, namely an inclination angle of an upper surface of a layer in contact with a lower surface of the first region 41. On such an assumption, an inclination angle of a lower surface of the first portion 21 of the lower electrode 2 is $\theta_i$, and an inclination angle of a lower surface of the organic layer 4 in the first region 41 is $\theta_j$. When the lower electrode 2 is formed in a constant layer thickness on the inclined portion 31, $\theta_i$ and $\theta_j$ are substantially equal to each other.

Here, the inclination angle $\theta_j$ is preferably 30° or greater and more preferably 50° or greater. When $\theta_i$ and $\theta_j$ are substantially equal to each other, the inclination angle $\theta_i$ is also preferably 30° or greater and more preferably 50° or greater. Under such a condition, the layer thickness T1 of the organic layer 4 in the first region 41 can be easily reduced, and an effect of suppressing the current leak between the sub-pixels SP can be increased. The reason is as follows.

Figure 6:
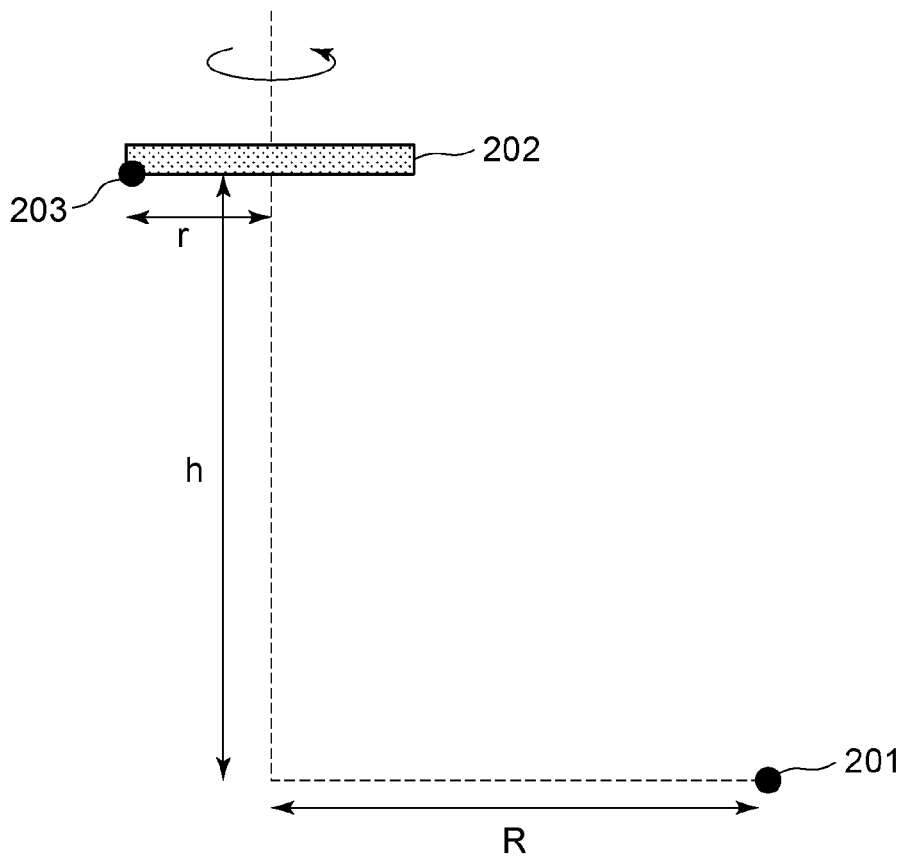
FIG. 6 illustrates a layout of members used in a film formation simulation.

A film formation simulation (vapor deposition simulation) with a vapor deposition method was carried out to find a desired inclination angle of the inclined portion 31 in the embodiment. FIG. 6 illustrates a layout representing a positional relation between a film forming source (deposition source) and a film formation target (substrate), the positional relation being the premise of the film formation simulation. Positions of a deposition source 201, a substrate 202, and an organic device 203 disposed on the substrate were set as illustrated in FIG. 6, and dimensions were set to R=200 mm, r=95 mm, and h=340 mm.

In a vapor deposition distribution expressed by the following formula (3), n=2 was set.

$$\phi = \phi_0 \cos^n \alpha \quad (3)$$

In the formula (3), $\alpha$ denotes an angle, $\phi$ denotes a vapor stream density at the angle $\alpha$, and $\phi_0$ denotes the vapor stream density at $\alpha=0$. Furthermore, it was premised that the substrate 202 rotates about a center of the substrate.

Assuming the case in which the inclined portion with the inclination angle of 0° to 90° is located on the substrate at a position of the organic device 203, a layer thickness in a region of an organic layer along the inclined portion at each inclination angle was calculated when the layer thickness of the organic layer at the inclination angle of 0° was 76 nm.

Figure 7:
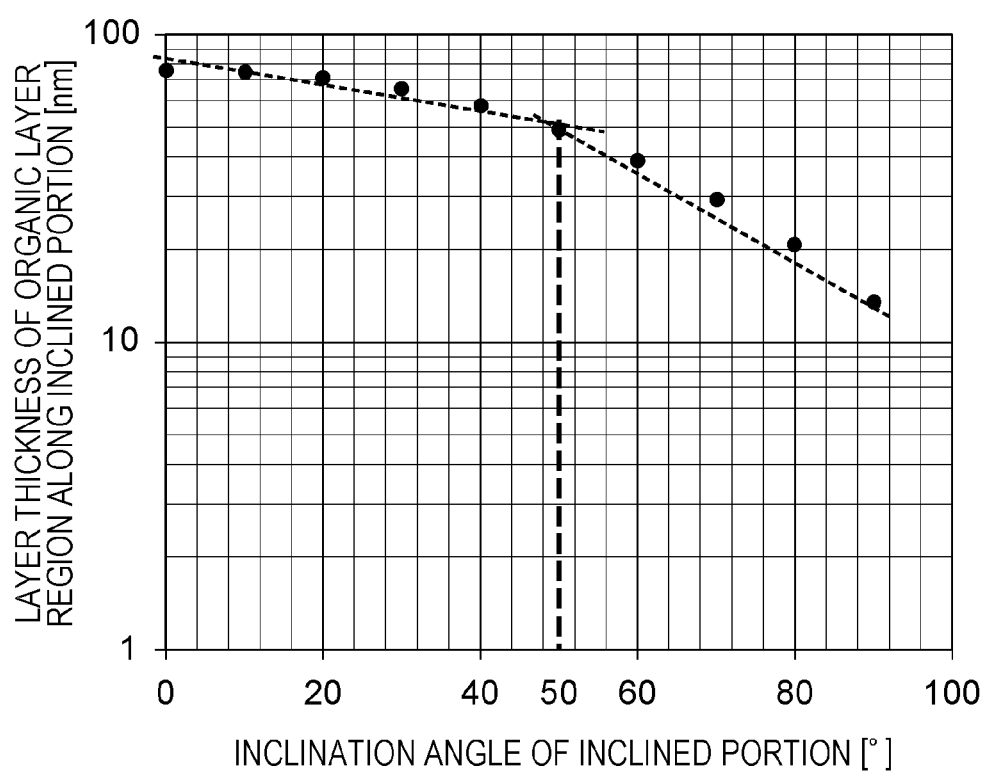
FIG. 7 is a graph depicting a result of the film formation simulation.

FIG. 7 depicts a result of the film formation simulation. As seen from FIG. 7, when the inclination angle is 30° or greater, the layer thickness T1 of the organic layer 4 in the first region 41 along the inclined portion 31 tends to reduce. It is further seen that, when the inclination angle is 50° or greater, the layer thickness T1 of the organic layer 4 in the first region 41 along the inclined portion 31 tends to further reduce.

On the other hand, the inclination angle $\theta_j$ of the inclined surface of the layer in contact with the lower surface of the organic layer 4 in the first region 41 is preferably smaller than 70° and more preferably smaller than 60°. Under such a condition, the thickness of the organic layer 4 in the first region 41 can be avoided from becoming too thin while the current leak between the lower electrode 2 and the upper electrode 5 can be suppressed.

The layer thickness T1 of the organic layer 4 positioned on the inclined portion 31 may be 20 nm or more. The layer thickness T1 of the organic layer 4 positioned on the inclined portion 31 is preferably 25 nm or more and especially preferably 33 nm or more. Under such a condition, the current leak between the lower electrode 2 and the upper electrode 5 can be further suppressed.

Second Embodiment

An organic light emitting apparatus according to a second embodiment of the present disclosure will be described below with reference to FIG. 8. The following description is made mainly a different point from the first embodiment.

Figure 8:
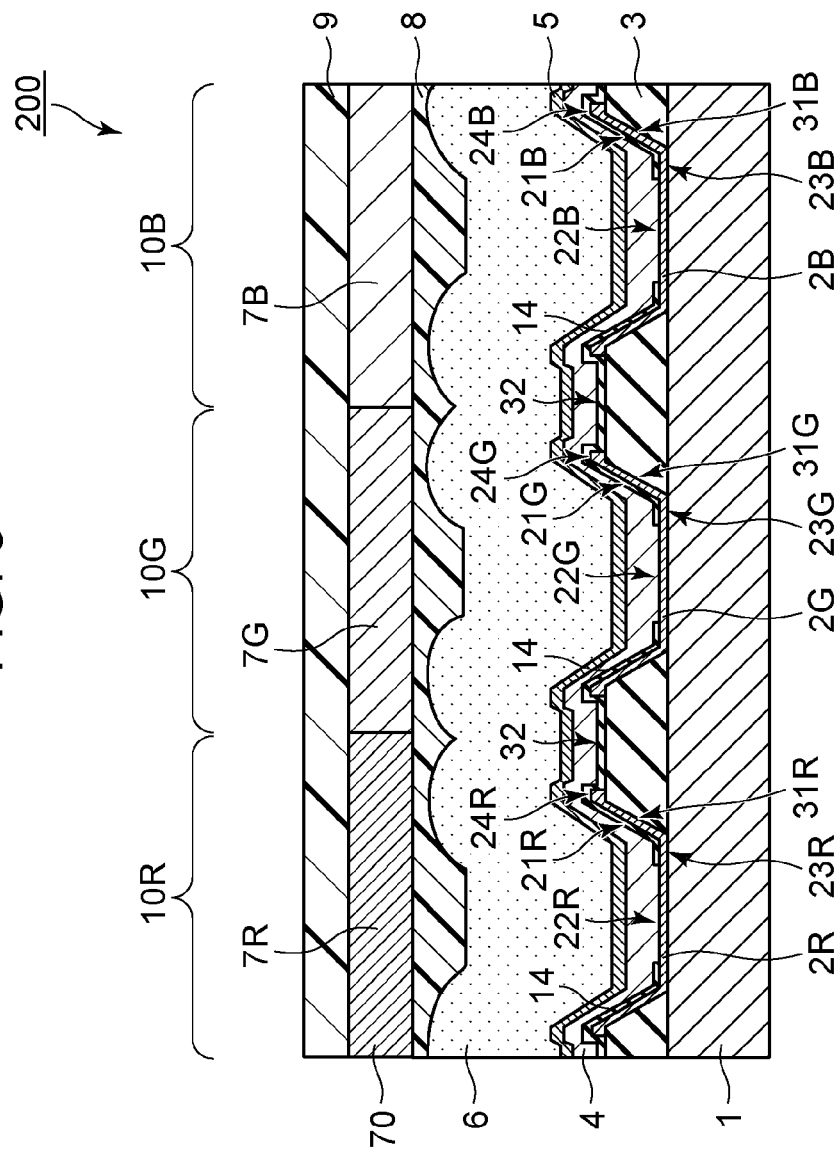
FIG. 8 is a sectional view illustrating a configuration of an organic light emitting apparatus according to a second embodiment.

FIG. 8 is a sectional view illustrating a configuration of the organic light emitting apparatus 200 according to the second embodiment. The organic light emitting apparatus 200 includes a second insulating layer 14 covering an end portion of the lower electrode 2 in addition to the configuration of the organic light emitting apparatus 100. Other configurations than the above point are the same as those in the organic light emitting apparatus 100 according to the first embodiment.

In this embodiment, the second insulating layer 14 covers the lower electrode 2 from the fourth portion 24 positioned on the flat portion 32 of the first insulating layer 3 to a flat portion of the lower electrode 2 positioned on the substrate 1. Here, a portion of the lower electrode 2, the portion being positioned between the first portion 21 and the second portion 22 and having a smaller inclination angle than the first portion 21 relative to the substrate, is called a third portion 23. Like the second portion 22, the third portion 23 may be a portion with an upper surface being parallel to the first surface of the substrate 1. The third portion 23 and the fourth portion 24 may be each a portion with an upper surface being parallel to the first surface of the substrate 1, but the third portion 23 is arranged at a position closer to the substrate 1 than the fourth portion 24. Thus, the second insulating layer 14 is positioned on the third portion 23, the first portion 21, and the fourth portion 24. Because the second insulating layer 14 is positioned on the first portion 21 positioned on the inclined portion 31, it can also be said that the second insulating layer 14 is positioned on the inclined portion 31. Furthermore, the second insulating layer 14 is continuously arranged to cover the end portion of the lower electrode 2 in each of the adjacent sub-pixels SP.

The lower electrode 2 is in contact with the organic layer 4 in its portion not covered by the second insulating layer 14, namely in an opening in the second insulating layer 14. In this embodiment, the lower electrode 2 is in contact with the organic layer 4 in a central region (second portion 22) of its portion positioned on the substrate 1. Accordingly, in this embodiment, the central region serves as the light emitting region. Stated in another way, the light emitting region is specified by the opening in the second insulating layer 14.

Also in this embodiment, since the lower electrode 2 and the organic layer 4 are arranged on the inclined portion 31 to reduce the layer thickness of the organic layer 4 and the electric field is applied between the lower electrode 2 and the upper electrode 5, the current leak between the sub-pixels SP can be suppressed. Furthermore, in this embodiment, since the second insulating layer 14 is arranged to cover the portion of the lower electrode 2 riding over the first insulating layer 3, the first portion 21 of the inclined portion 31 is not in contact with the organic layer 4. Thus, since the charges are not injected into the organic layer 4 from the lower electrode 2 positioned on the inclined portion 31, the light emission in the first region 41 of the organic layer 4 is less likely to occur than in the first embodiment.

In the first embodiment, since the resistance of the organic layer 4 (the first region 41) on the inclined portion 31 is low, a quantity of light emission due to recombination caused by the charges injected from the lower electrode 2 on the inclined portion 31 tends to increase. However, the light emitted from the organic layer 4 (the first region 41) on the inclined portion (the first portion 21) of the lower electrode 2 is harder to be taken out toward the front direction of the light emitting element 10 than the light emitted from the organic layer 4 (the second region 42) on the flat portion (the second portion 22) of the lower electrode 2. In other words, the light emission in the first region 41 is less likely to contribute to the emission efficiency of the light emitting element 10 than the light emission in the second region 42. Accordingly, when the charges are injected in the configuration of the first region 41 being also in contact with the lower electrode 2 as in the first embodiment, the emission efficiency is reduced in some cases.

On the other hand, in this embodiment, the first region 41 is not in contact with the lower electrode 2, and only the second region 42 is in contact with the lower electrode 2. Therefore, the charges are concentratedly injected into the second region 42, and hence the light efficiency can be increased. Furthermore, since the charges having been injected into the second region 42 but having flowed toward the adjacent sub-pixel SP are caused to undergo the recombination and to emit light in the first region 41, the current leak between the sub-pixels SP is suppressed. Moreover, in this embodiment, since the second insulating layer 14 is positioned on the third portion 23, the charges from the lower electrode 2 are not injected to a portion (third region (not illustrated)) of the organic layer 4 positioned on the third portion 23, and an electric field is applied thereto. Hence the charge recombination is promoted in the third region as well. Accordingly, the charges having flowed toward the second region 42 from the first region 41 is caused to undergo the recombination midway, and those charges are harder to reach the second region 42. As a result, the emission efficiency can be further increased.

Third Embodiment

An organic light emitting apparatus according to a third embodiment of the present disclosure will be described below with reference to FIG. 9. The following description is made mainly about a different point from the second embodiment.

The organic light emitting apparatus 300 according to the third embodiment includes a reflecting layer 12 between the substrate 1 and the lower electrode 2 in addition to the configuration of the organic light emitting apparatus 200 according to the second embodiment. On the reflecting layer 12, the first insulating layer 3 is arranged to cover the reflecting layer 12. In the organic light emitting apparatus 200, the second portion 22 of the lower electrode 2 is formed on the substrate 1 in contact with the substrate 1. In the organic light emitting apparatus 300, however, the second portion 22 of the lower electrode 2 is formed on a second flat portion 35 of the first insulating layer 3.

The reflecting layer 12 is a layer reflecting the light generated from the organic layer 4 and propagating toward the substrate 1. The reflecting layer 12 may be separated for each sub-pixel SP. FIG. 9 illustrates an example in which the reflecting layer 12 is separated for each sub-pixel SP. The first sub-pixel SPR includes a first reflecting layer 12R, the second sub-pixel SPG includes the second reflecting layer 12G, and the third sub-pixel SPB includes the third reflecting layer 12B.

From the viewpoint of the emission efficiency of the organic light emitting apparatus 300, a material with a reflectance of 50% or more for visible light may be used as the reflecting layer 12. More specifically, a metal such as Al or Ag, or an alloy obtained by adding, for example, Si, Cu, Ni, Nd or Ti to any of those metals may be used as the reflecting layer 12. The reflecting layer 12 may include a barrier layer formed on its surface reflecting the light. A metal such as Ti, W, Mo or Au, an alloy of any of those metals, or a transparent conductive oxide such as ITO or IZO may be used as a material of the barrier layer on the reflecting layer 12.

The reflecting layer 12 may include a conductive layer 13 on a peripheral region of the reflecting layer 12. The conductive layer 13 is made of, for example, Ti or TiN and may serve as the above-mentioned barrier layer. With the presence of the conductive layer 13 formed on the reflecting layer 12, a resistance can be reduced when the reflecting layer 12 and the lower electrode 2 are electrically connected to each other. For example, each lower electrode 2 may extend up to a position on an opening (contact hole) formed in the first insulating layer 3 and may be electrically connected, through the opening, to the conductive layer 13 that is arranged on the peripheral portion of the reflecting layer 12 to be positioned under the opening.

According to this embodiment, since the reflecting layer 12 is formed on the first surface of the substrate 1, a lower surface of the reflecting layer 12 coincides with the first surface. Hence the lower surface of the reflecting layer 12 may be regarded as the first surface.

The first insulating layer 3 is a light-transparent insulating layer positioned between the reflecting layer 12 and the lower electrode 2. The first insulating layer 3 included in the organic light emitting apparatus 300 is continuously arranged over the multiple sub-pixels SP, but a thickness of the first insulating layer 3 is different for each of the sub-pixels SP. Such an arrangement may provide a configuration (resonance structure) of optimizing an optical path length between the reflecting layer 12 and a light emitting position in the light emitting layer of the organic layer 4 for each color. Hence the first insulating layer 3 can also be said as an optical adjustment layer.

The first insulating layer 3 may be constituted by a single layer or multiple layers. The first insulating layer 3 may be constituted by multiple layers, and the number of laminated layers may be different for each sub-pixel SP. A material of the first insulating layer 3 is not limited to particular one and, for example, silicon oxide (SiOx) may be used.

The lower electrode 2 is positioned on the first insulating layer 3. As described above, the lower electrode 2 is arranged to be electrically separated for each sub-pixel SP. The lower electrode 2 may be made of a transparent material, for example, an oxide conductor such as ITO, IZO, ZnO, AZO, or IGZO. The first insulating layer 3 and the lower electrode 2 are each optically transparent.

The optical path length between the upper electrode 5 and the reflecting layer 12 in the organic light emitting apparatus 300 according to this embodiment may be set to provide an enhancing interference structure. The enhancing interference structure can also be called the resonance structure.

By forming the organic layer 4 and the first insulating layer 3 to satisfy an enhancing optical interference condition, intensity of the light taken out from the organic light emitting apparatus can be increased with optical interference. By setting an optical condition to enhance the light taken out toward the front direction, the light can be more efficiently emitted toward the front direction. It is also known that a half-value width of an emission spectrum of the light enhanced with the optical interference is reduced in comparison with that of the emission spectrum before the interference. In other words, the color purity can be increased.

In designing the organic light emitting apparatus for light with a wavelength $\lambda$, the enhancing interference can be realized by adjusting a distance do from the light emitting position in the light emitting layer of the organic layer 4 to a reflecting surface of the reflecting layer 12 to $d_0 = i\lambda/4n_0$ (i=1, 3, 5, . . . ).

As a result, a component propagating toward the front direction is increased in a radiation distribution of the light with the wavelength $\lambda$, and front brightness is increased. In the above formula, no denotes a refractive index of the layer between the light emitting position and the reflecting surface at the wavelength $\lambda$.

In this embodiment, to optimize the optical path length from the light emitting position in the light emitting layer of the organic layer 4 to the reflecting layer 12 for each color, an optical path length Lr from the light emitting position in the light emitting layer of the organic layer 4 to the reflecting surface (for example, an upper surface) of the reflecting layer 12 is set to substantially satisfy the following formula (4). The optical path length Lr is a total of the products of refractive indexes $n_j$ and thicknesses $d_j$ of individual layers in the organic layer. Thus, Lr can be expressed by $\Sigma n_j \times d_j$ or $n_0 \times d_0$. In the formula (4), $\phi$ denotes a negative value.

$$Lr = (2m - (\phi r/\pi)) \times (\lambda/4) \qquad (4)$$

In the above formula (4), m denotes an integer of 0 or more (a non-negative integer), and $\phi r$ denotes the sum [rad] of phase shifts when the light with the wavelength $\lambda$ is reflected at the reflecting surfaces. In the case of $\phi r = -\pi$ and m=0, Lr=$\lambda/4$ is obtained. In the case of $\phi r = -\pi$ and m=1, Lr=$3\lambda/4$ is obtained. Hereinafter, the condition of m=0 in the above formula (4) is called a $\lambda/4$ interference condition, and the condition of m=1 in the above formula (4) is called a $3\lambda/4$ interference condition.

Furthermore, an optical path length Ls between the light emitting position in the light emitting layer of the organic layer 4 and a reflecting surface (for example, a lower surface) of the upper electrode 5 is set to satisfy the following formula (5).

$$Ls = (2m' - (\phi s/\pi)) \times (\lambda/4) = -(\phi s/\pi) \times (\lambda/4) \qquad (5)$$

In the above formula (5), m' denotes an integer of 0 or more (a non-negative integer), and $\phi s$ denotes the sum [rad] of phase shifts when the light with the wavelength $\lambda$ is reflected at the reflecting surface.

Thus, total layer interference L from the reflecting layer 12 to the upper electrode 5 is set to substantially satisfy the following formula (6).

$$L = (Lr + Ls) = (2m - (\phi/\pi)) \times (\lambda/4) \qquad (6)$$

In the above formula (6), $\phi$ denotes the sum ($\phi r + \phi s$) of the phase shifts when the light with the wavelength $\lambda$ is reflected at the reflecting surface 12 and the upper electrode 5.

Taking into consideration a viewing angle characteristic and so on which are in a trade-off relation to light extraction efficiency in the front direction, the total layer interference L does not need to be exactly matched with a value satisfying the above-described formula in the actual organic light emitting apparatus. More specifically, the total layer interference L may include an error within a numerical range of $\pm\lambda/8$ from the value satisfying the formula (6). An allowable value within which the value of the total layer interference L may deviate from the interference condition may be 50 nm or more and 75 nm or less.

Thus, the organic light emitting apparatus 300 according to this embodiment preferably satisfies the following formula (7). Furthermore, the total layer interference L is just needed to fall within a numerical range of $\pm\lambda/16$ from the value satisfying the formula (6) and preferably satisfies the following formula (7').

$$(\lambda/8)\times(4m-(2\phi/\pi)-1)<L<(\lambda/8)\times(4m-(2+/\pi)+1) \quad (7)$$

$$(\lambda/16)\times(8m-(4\phi/\pi)-1)<L<(\lambda/16)\times(8m-(4\phi/\pi)+1) \quad (7')$$

Here, the emission wavelength $\lambda$ may be an emission wavelength at which the intensity of the emission light has a maximum peak. In light emission of organic compounds, when an emission spectrum includes multiple peaks, it is general that the intensity of the emission light is maximum at one of those peaks with the shortest wavelength. Therefore, the emission wavelength may be the wavelength at the peak with the shortest wavelength. The emission spectrum indicates an emission spectrum after passing through the color filter (CF) of each light emitting element.

A preferred example of the organic light emitting apparatus 300 according to this embodiment will be described below.

Figure 9:
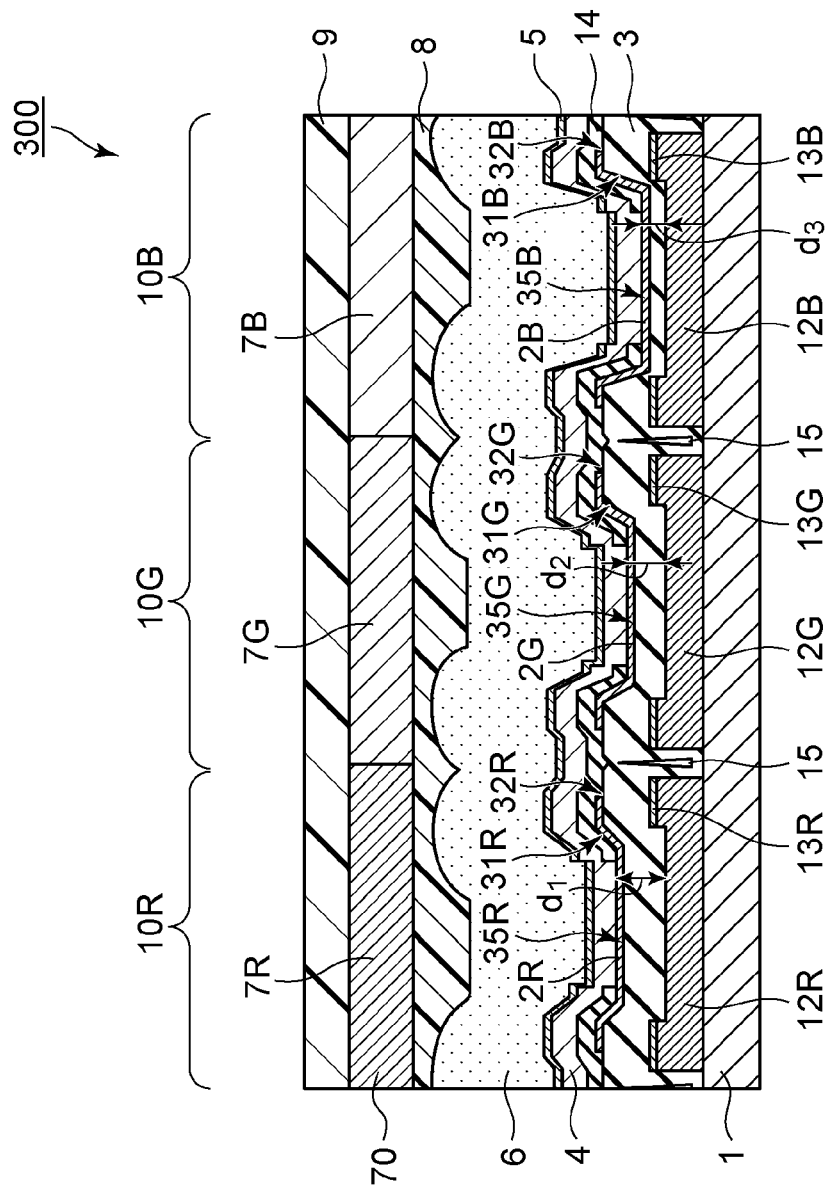
FIG. 9 is a sectional view illustrating a configuration of an organic light emitting apparatus according to a third embodiment.

As illustrated in FIG. 9, a distance $d_1$ from an upper surface of the first reflecting layer 12R in the first light emitting element 10R to an upper surface of the first lower electrode 2R and a distance $d_2$ from an upper surface of the second reflecting layer 12G in the second light emitting element 10G to an upper surface of the second lower electrode 2G are preferably different from each other. The distance $d_1$ is a shortest distance from the upper surface of the first reflecting layer 12R in the first light emitting element 10R to the upper surface of the first lower electrode 2R. The distance $d_2$ is a shortest distance from the upper surface of the second reflecting layer 12G in the second light emitting element 10G to the upper surface of the second lower electrode 2G. Furthermore, the distance $d_1$, the distance $d_2$, and a distance $d_3$ from an upper surface of the third reflecting layer 12B in the third light emitting element 10B to an upper surface of the third lower electrode 2B are preferably all different from one another. The distance $d_3$ is a shortest distance from the upper surface of the third reflecting layer 12B in the third light emitting element 10B to the upper surface of the third lower electrode 2B.

Moreover, as illustrated in FIG. 9, the distances $d_1$ to $d_3$ preferably satisfy the following formula (8) or (9).

$$d_1>d_2 \quad (8)$$

$$d_1>d_2>d_3 \quad (9)$$

In this embodiment, the end portions of the lower electrodes 2 in the light emitting elements 10 may have the same height. With this feature, since a focus height in exposure is not changed for each of the light emitting elements 10 when the lower electrode 2 is patterned by photolithography, the lower electrode 2 can be patterned with high accuracy. In this embodiment, a height of the flat portion 32 of the first insulating layer 3 is set to be constant for all the sub-pixels SP. Stated in another way, upper surfaces of the flat portions 32 of the first insulating layers 3 included in the individual sub-pixels SP are present on the same plane. The second flat portion 35 of the first insulating layer 3 is set to be different in thickness for each sub-pixel SP from the viewpoint of causing the second flat portion 35 to serve as the optical adjustment layer. Stated in another way, upper surfaces of the second flat portions 35 are present on different planes for each of the sub-pixels SP. Such a feature may be realized by changing the number of layers constituting the second flat portion 35 for each sub-pixel SP. On the other hand, thicknesses of the flat portions 32 of the first insulating layer 3 are set to be constant. Such a feature may be realized by setting the numbers of layers constituting the flat portions 32 to be the same in all the sub-pixels SP. Thus, by arranging the end portions of the lower electrodes 2 on the flat portions 32 with the same height, the heights of the end portions of the lower electrodes 2 in the individual sub-pixels SP can be made the same.

On the contrary, in the case of patterning the lower electrode 2 such that the end portion of the lower electrode 2 is formed on the second flat portion 35, because the second flat portion 35 has a different height for each sub-pixel SP, the heights of the end portions of the individual lower electrodes 2 are different from one another. Therefore, the focus height in the exposure for patterning is different for each sub-pixel SP.

Figure 10:
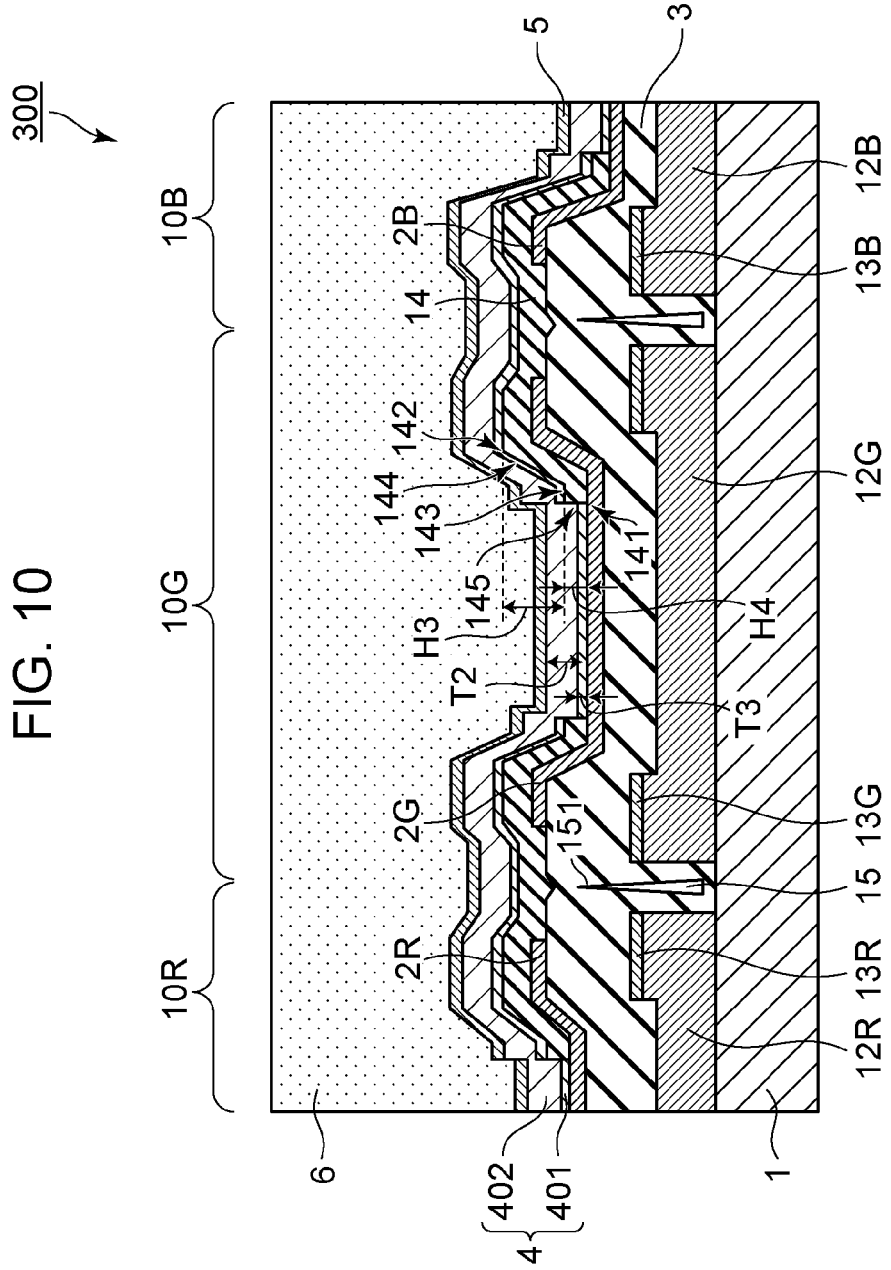
FIG. 10 is a partial enlarged view of FIG. 9.

FIG. 10 is a partial enlarged view of FIG. 9. The second insulating layer 14 is arranged to cover the lower electrode 2 riding over the first insulating layer 3, and an end portion 141 of the second insulating layer 14 is positioned on the third portion 23 of the lower electrode 2. The second insulating layer 14 is arranged across the adjacent sub-pixels SP and has two top portions. Here, the wording "top portion" implies a portion in which, when looking at the second insulating layer 14 while following its upper surface from the one end portion 141 to the other end portion 141, an inclination of the second insulating layer 14 changes from an upward slope to a downward slope. The top portion may include a flat zone, and a portion in which the inclination changes from an upward slope to a downward slope with the flat zone interposed therebetween can also be regarded as the top portion. Assuming an end of the top portion closer to the end portion 141 to be an upper end 142, the second insulating layer 14 has, between the end portion 141 and the upper end 142, a parallel portion 143 that is substantially parallel to the first surface of the substrate 1. The second insulating layer 14 further has an upper inclined portion 144 between the parallel portion 143 and the upper end 142, and a lower inclined portion 145 between the end portion 141 and the parallel portion 143.

In the above-described arrangement, a length H3 of the upper inclined portion 144 in a height direction is preferably longer than a length H4 of the lower inclined portion 145 in the height direction. The upper inclined portion 144 is a slope formed by the second insulating layer 14 being arranged on both the inclined portion 31 of the first insulating layer 3 and the lower electrode 2, and the lower inclined portion 145 is defined by an end lateral surface of the second insulating layer 14. The first region 41 of the organic layer 4 is positioned on the upper inclined portion 144, and the current leak between the sub-pixels SP is suppressed with an electric field between the lower electrode 2 and the upper electrode 5 applied to the first region 41. Accordingly, the current leak between the sub-pixels SP can be further suppressed by increasing the length of the upper inclined portion 144.

The length H4 of the lower inclined portion 145 in the height direction is preferably longer than a length (thickness) T3 of a charge transport layer 401 (typically, a hole transport layer) in the height direction in its portion contacting the lower electrode 2. Under such a condition, the charge transport layer 401 can be easily made thinner along the lower inclined portion 145. As a result, the charge crosstalk (namely, the current leak) between the sub-pixels SP can be suppressed.

Furthermore, the length H4 of the lower inclined portion 145 in the height direction is preferably shorter than a length (thickness) T2 of the organic layer 4 in the height direction in its portion contacting the lower electrode 2. Under such a condition, because part of the organic layer 4 positioned along the lower inclined portion 145 is buried in part of the organic layer 4 formed in a region parallel to the substrate 1, a region where the organic layer 4 becomes too thin is less likely to occur. As a result, the current leak between the upper electrode 5 and the lower electrode 2 can be suppressed.

Moreover, it is preferable that the length H4 of the lower inclined portion 145 in the height direction be shorter than a length H3 of the upper inclined portion 144 in the height direction, and that the lower inclined portion 145 be an inclined portion with a greater inclination angle in a steepest region than the upper inclined portion 144. Stated in another way, the lower inclined portion 145 is preferably steeper than the upper inclined portion 144. Thus, because the lower inclined portion 145 has a greater inclination angle, the charge transport layer 401 arranged on the lower inclined portion 145 can be easily made thinner. On the other hand, since the length of the lower inclined portion 145 in the height direction is set to be relatively short, the organic layer 4 arranged on the lower inclined portion 145 can be avoided from becoming too thin. As a result, the suppression of the current leak (charge crosstalk) between the sub-pixels SP and the suppression of the current leak between the upper electrode 5 and the lower electrode 2 can be realized at the same time. Furthermore, since the upper inclined portion 144 is a slope with a relatively small inclination angle, the organic layer 4 arranged on the upper inclined portion 144 can be avoided from becoming too thin. In addition, since the length of the upper inclined portion 144 in the height direction is increased, a length of a region where the electric field is applied to the organic layer 4 positioned on the upper inclined portion 144 can be increased. Hence the current leak between the sub-pixels SP and the current leak between the upper and lower electrodes 5 and 2 can be further suppressed at the same time.

In this embodiment, a central portion of the reflecting layer 12 is preferably thinner than an outer peripheral portion. In other words, it is preferable that a thickness of the reflecting layer 12 be different between a portion positioned under the second portion 22 of the lower electrode 2 and a portion positioned under the flat portion 32 of the first insulating layer 3, and that the portion positioned under the flat portion 32 of the first insulating layer 3 has a greater thickness. Furthermore, the first insulating layer 3 is preferably arranged across a step that is formed between the above-mentioned two portions with different thicknesses. With such a configuration, the inclined portion 31 of the first insulating layer 3 on the reflecting layer 12 can be easily formed in a manner of reflecting the shape of the reflecting layer 12. As a result, the charge crosstalk between the sub-pixels SP can be suppressed.

Fourth Embodiment

An organic light emitting apparatus 400 according to a fourth embodiment of the present disclosure will be described below with reference to FIG. 11. The following description is made mainly about a different point from the third embodiment.

Figure 11:
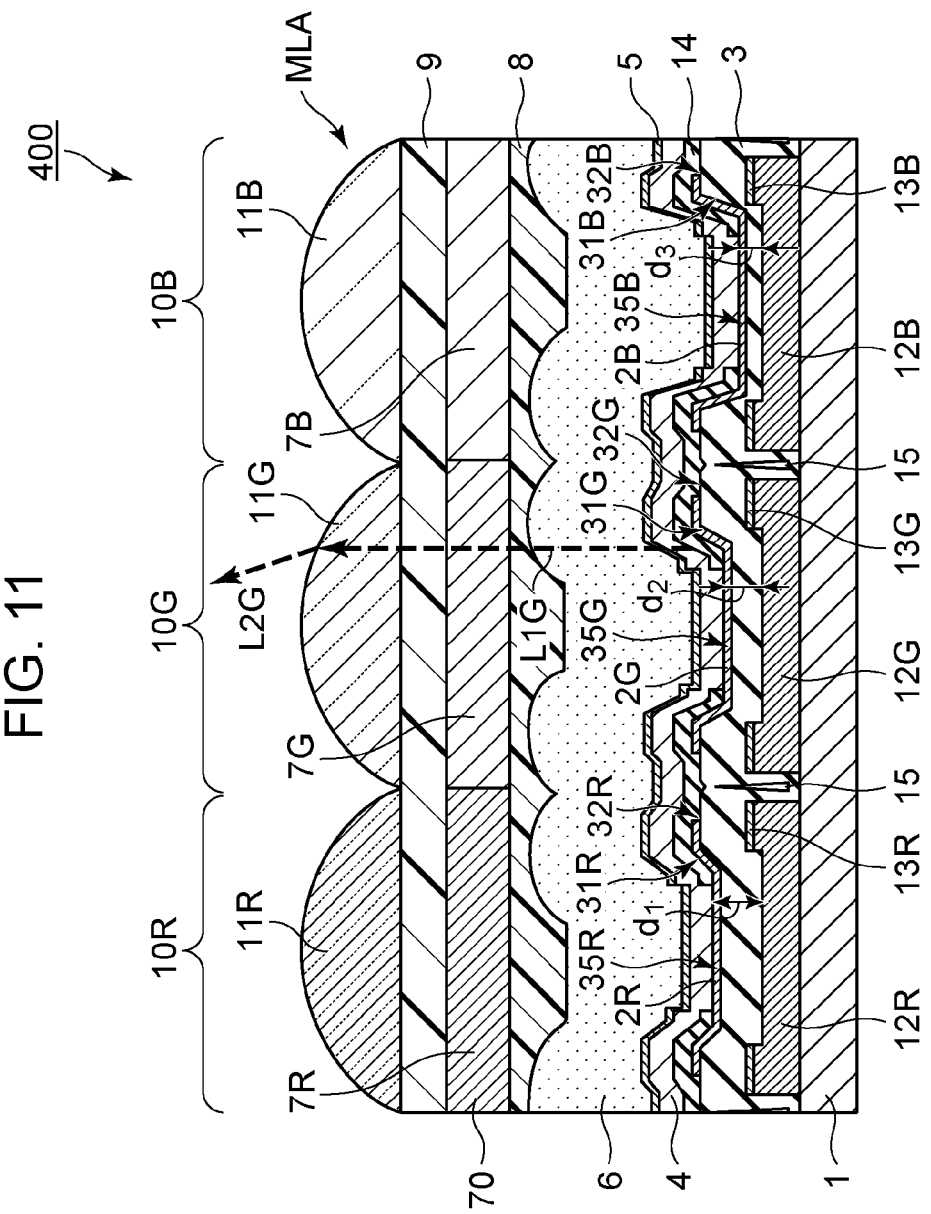
FIG. 11 is a sectional view illustrating a configuration of an organic light emitting apparatus according to a fourth embodiment.

FIG. 11 is a sectional view illustrating a configuration of the organic light emitting apparatus 400 according to the fourth embodiment. The organic light emitting apparatus 400 includes a microlens array MLA on the second planarization layer 9 in addition to the configuration of the organic light emitting apparatus 300. The other configurations than the above point are the same as in the organic light emitting apparatus 300 according to the third embodiment.

The microlens array MLA includes a first microlens 11R corresponding to the first light emitting element 10R, a second microlens 11G corresponding to the second light emitting element 10G, and a third microlens 11B corresponding to the third light emitting element 10B. Each of those microlenses 11 is arranged to overlap a center of the light emitting region of the corresponding light emitting element 10 in the plan view. The light emitting region of the corresponding light emitting element 10 is defined by the opening in the second insulating layer 14, and the center of the light emitting region may be set to a gravity center of the opening in the second insulating layer 14.

The microlenses 11 constituting the microlens array MLA may be each a microlens known in the art. A material of the microlens 11 may be resin. The microlens array MLA can be formed, for example, by forming a film (photoresist film) made of the material to be used to form the microlens 11, and then performing exposure and development on the photoresist film by using a mask with a continuous gradation change. A grey mask or an area gradation mask can be used as the above-mentioned mask. Moreover, a lens shape may be adjusted by performing an etch back process on the microlens 11 that has been formed through an exposure and development process. The shape of the microlens 11 is just required to be able to refract the emitted light, and the lens shape may be spherical or aspherical. A sectional shape of the microlens 11 may be asymmetric.

An emergent surface side of the microlens 11, namely an opposite side of the microlens 11 to the color filter 7, is preferably filled with a material with a lower refractive index than the microlens 11, typically air. Under that condition, a light condensing effect of the microlens 11 can be increased.

In the first region 41 of the organic layer 4 along the inclined portion 31, the charge recombination is promoted with an effect of the electric field applied between the upper electrode 5 and the lower electrode 2. In this embodiment, although the lower electrode 2 along the inclined portion 31 is covered by the second insulating layer 14, charges are moved along the charge transport layer 401 that is included in the organic layer 4 positioned on the second portion 22, and may reach the first region 41 of the organic layer 4 along the inclined portion 31. Those charges are subjected to the recombination in the first region 41, whereby the first region 41 of the organic layer 4 emits light.

In this embodiment, as described above, the optical path length is adjusted depending on the color of the light emitted from the light emitting element 10, whereby the emitted light is enhanced and output to the outside. However, because the inclined portion 31 of the first insulating layer 3 is present under the first region 41 of the organic layer 4 along the inclined portion 31, there is a deviation from the optical path length that has been adjusted on the basis of the second region 42. Accordingly, light L1G emitted due to the charge recombination from the first region 41 of the organic layer 4 along the inclined portion 31 and output to the outside becomes light that is enhanced at a wavelength deviated from the desired wavelength. Taking into consideration the above point, in this embodiment, the microlens 11 is arranged such that the first region 41 of the organic layer 4 along the inclined portion 31 and an inclined portion of the microlens 11 overlap each other in the plan view. With such an arrangement, the light emitted from the first region 41 toward the front direction of the light emitting element 10 is refracted by the microlens 11 and is produced as light L2G emitted in a direction deviated from the front direction. Hence the light L2G is less likely to be taken out toward the front direction.

With the provision of the microlens array MLA, therefore, the color purity of the light output from the light emitting element 10 can be improved.

Fifth Embodiment

An organic light emitting apparatus 500 according to a fifth embodiment of the present disclosure will be described below with reference to FIG. 12. The following description is made mainly about a different point from the third embodiment.

Figure 12:
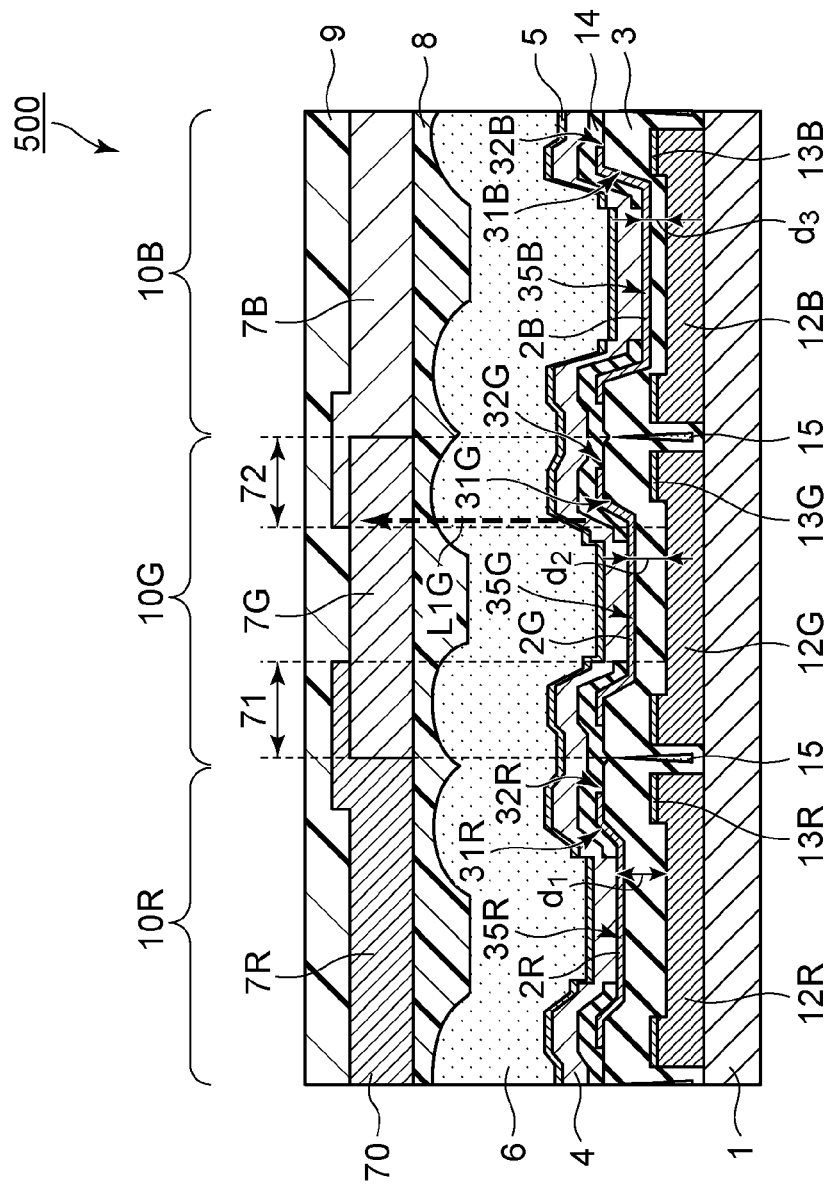
FIG. 12 is a sectional view illustrating a configuration of an organic light emitting apparatus according to a fifth embodiment.

FIG. 12 is a sectional view illustrating a configuration of the organic light emitting apparatus 500 according to the fifth embodiment. The organic light emitting apparatus 500 is the same as the organic light emitting apparatus 300 according to the third embodiment except that there is a region where adjacent filters for different colors among the color filters 7 included in the color filter layer 70 partially overlap each other.

The organic light emitting apparatus 500 includes an overlap region 71 where the end portion of the first color filter 7R rides over and overlaps the end portion of the second color filter 7G. The organic light emitting apparatus 500 further includes an overlap region 72 where the end portion of the third color filter 7B rides over and overlaps the end portion of the second color filter 7G.

In this embodiment, the first region 41 of the organic layer 4 along the inclined portion 31 is arranged at a position that is aligned in the plan view with the overlap region (71, 72) where the color filters 7 overlap each other. With such an arrangement, the light L1G emitted from the first region 41 of the organic layer 4 along the inclined portion 31 can be absorbed by two kinds of the color filters 7. In view of that the light emitted from the first region 41 is light with lower color purity as described above, this embodiment is intended to reduce or block the above-mentioned light by the overlap region of the color filters 7 and to make that light less likely to be taken out to the outside. As a result, the color purity of the light output from the light emitting element 10 can be further improved.

The sealing (protective) layer 6 may have a lower-density region (not illustrated) between the second portions 22 of the lower electrodes 2 in the two adjacent light emitting elements 10 in the plan view. The lower-density region is preferably arranged at a position overlapping the first region 41 in the plan view. As discussed above, the light emitted from the first region 41 and output to the outside becomes the light enhanced at the wavelength deviated from the desired wavelength and is a factor reducing the color purity. Furthermore, there is a possibility that the light emitted from the first region 41 of the organic layer 4 along the inclined portion 31 is emitted toward the color filter 7 in the adjacent light emitting element 10. If the light emitted from the first region 41 passes through the color filter 7 in the adjacent light emitting element 10 and is output, color mixing occurs. With the sealing layer 6 having the lower-density region as described above, the light is scattered by the lower-density region and becomes less likely to be taken out to the outside.

As a result, the color purity of the light emitted from the light emitting element 10 can be further improved. Here, the term "density" may represent an atomic density [atom/cm$^3$] or a weight density [g/cm$^3$].

Other Embodiments

The above embodiments have been described in connection with the configuration that the sub-pixels SPR, SPG, and SPB include the color filters 7R, 7G, and 7B, respectively, and that the first to third lights are emitted by causing the white light generated from the organic layer 4 to pass through the corresponding color filters 7. However, the invention is not limited to such a case, and the sub-pixels SP may not need to include the color filters 7. More specifically, another configuration that, in each of the above embodiments, at least the light emitting layer among the multiple layers constituting the organic layer 4 is formed to be separated for each of the sub-pixels also falls within the scope of the present disclosure. In that configuration, the first sub-pixel SPR may include a first light emitting layer configured to emit the light of the first color, the second sub-pixel SPG may include a second light emitting layer configured to emit the light of the second color, and the third sub-pixel SPB may include a third light emitting layer configured to emit the light of the third color. At least part of the other layers than the light emitting layer among the multiple layers constituting the organic layer 4 may be arranged in common to the multiple sub-pixels SP. Such an embodiment can also provide the effect of increasing the light extraction efficiency while the current leak between the pixels is suppressed.

The above embodiments have been described in connection with the case in which an element in the electronic device is the organic light emitting element, namely the case in which the electronic device is the organic light emitting apparatus. In that case, the functional layer in the electronic device may be an organic layer including a light emitting layer. On the other hand, the element in the electronic device may be a photoelectric conversion element, and the electronic device may be a photoelectric conversion apparatus. In that case, the functional layer in the electronic device may be an organic layer including a photoelectric conversion layer.

Figure 13:
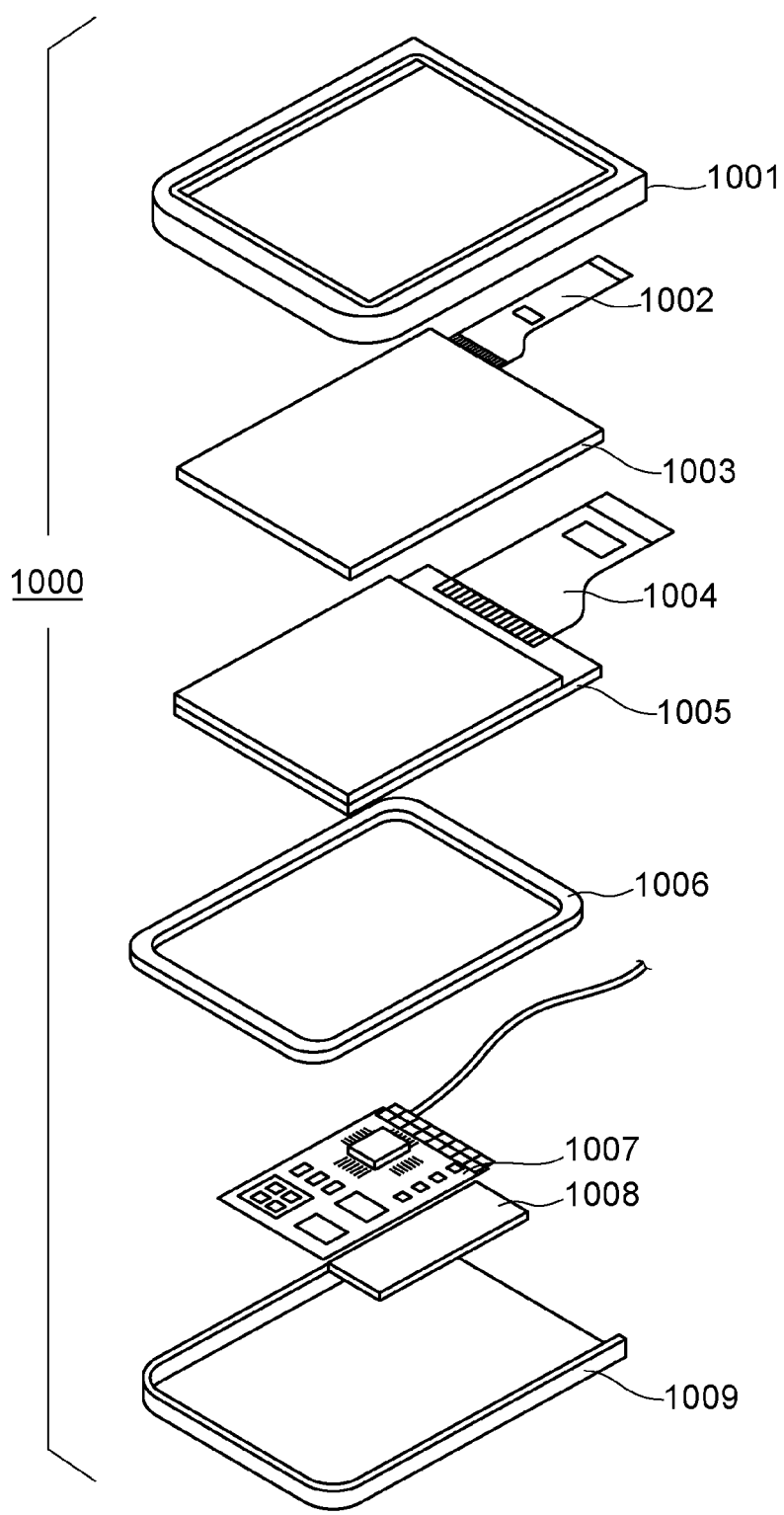
FIG. 13 is a schematic view illustrating an example of a display apparatus.

FIG. 13 is a schematic view illustrating an example of a display apparatus according to an embodiment. A display apparatus 1000 may include, between an upper cover 1001 and a lower cover 1009, a touch panel 1003, a display panel 1005, a frame 1006, a circuit board 1007, and a battery 1008. Flexible printed circuits FPC 1002 and 1004 are connected respectively to the touch panel 1003 and the display panel 1005. Transistors are formed on the circuit board 1007 by printing. The battery 1008 may not need to be included when the display apparatus is not portable, or may be disposed in another location even in the case of a portable apparatus.

The display apparatus according to the embodiment may include color filters of red, green, and blue. Those color filters may be constituted with red, green, and blue colors arranged in the delta array.

The display apparatus according to the embodiment may be used in a display unit of a portable terminal. On that occasion, the display apparatus may have both a display function and an operating function. The portable terminal may be, for example, a mobile phone such as a smartphone, a tablet, or a head mounted display.

The display apparatus according to the embodiment may be used in a display unit of an imaging apparatus including an optical unit equipped with multiple lenses, and an imaging element arranged to receive light having passed through the optical unit. The display unit of the imaging apparatus may be configured to display information obtained by the imaging element. The display unit may be a display unit exposed to the outside of the imaging apparatus, or a display unit disposed in a finder. The imaging apparatus may be a digital camera or a digital video camera.

Figure 14A:
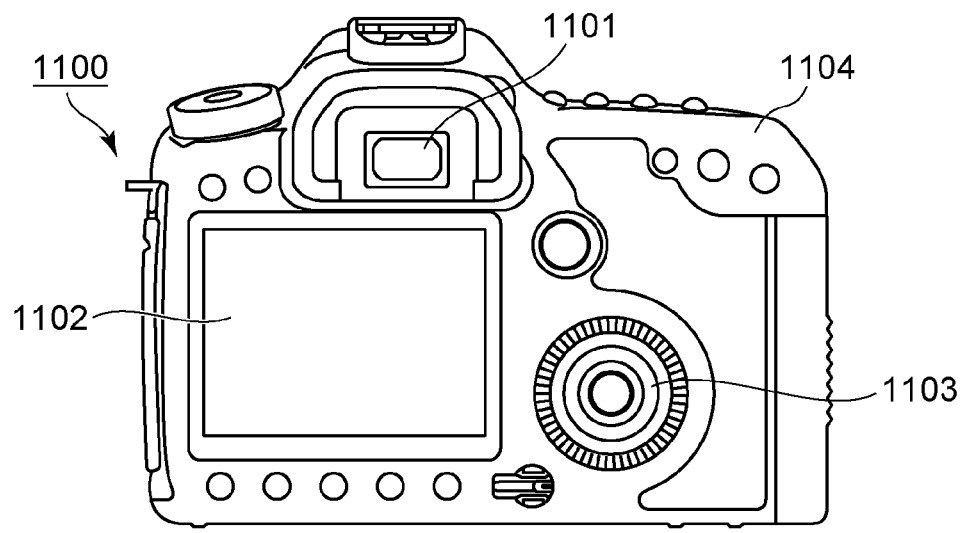
FIGS. 14A and 14B are each a schematic view illustrating an example of an imaging apparatus.

FIG. 14A is a schematic view illustrating an example of an imaging apparatus according to an embodiment. An imaging apparatus 1100 may include a view finder 1101, a back display 1102, an operating unit 1103, and a casing 1104. The viewfinder 1101 may include the display apparatus according to the embodiment. In such a case, the display apparatus may display not only an image to be sensed, but also environment information, an image-taking instruction, and so on. The environment information may contain, for example, intensity of extraneous light, a direction of the extraneous light, a moving speed of an object, and a possibility that the object is obstructed by an obstacle.

Because good timing for taking an image is limited to a short period of time, it is desired to display the information as soon as possible. The display apparatus using the organic light emitting element according to the present disclosure is preferably used from that point of view. This is because the organic light emitting element has a high response speed. The display apparatus using the organic light emitting element can be more suitably used in apparatuses that are demanded to have higher display speeds than a liquid crystal display apparatus.

The imaging apparatus 1100 includes an optical unit (not illustrated). The optical unit includes multiple lenses and focuses an image onto an imaging element disposed in the casing 1104. The lenses can adjust a focal point by adjusting relative positions of the lenses. The focus adjustment can be automated. The imaging apparatus may be also called a photoelectric conversion apparatus. The photoelectric conversion apparatus may adopt, as an imaging method, not only a method of sequentially taking images, but also a method of detecting a difference from a preceding image, a method of always extracting part of a recorded image, and so on.

Figure 14B:
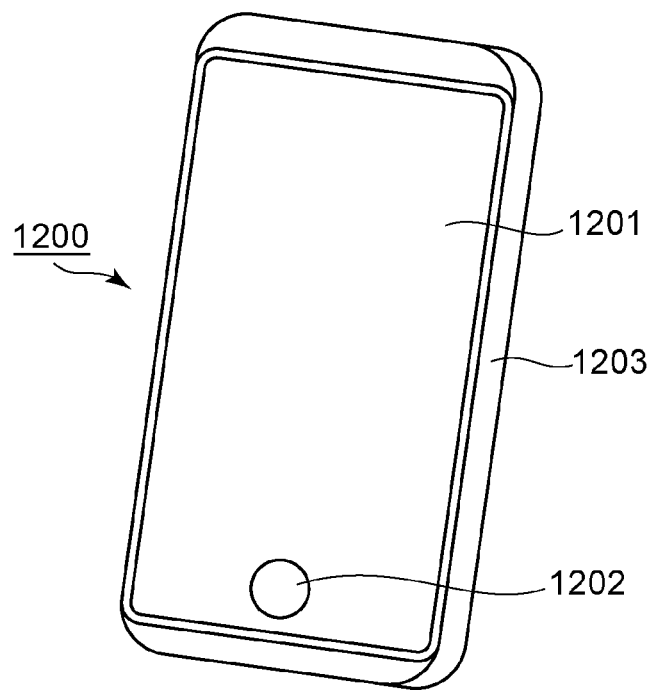

FIG. 14B is a schematic view illustrating an example of electronic equipment according to an embodiment. An electronic equipment 1200 includes a display unit 1201, an operating unit 1202, and a casing 1203. The casing 1203 may accommodate circuits, a printed board on which the circuits are formed, a battery, and a communication unit. The operating unit 1202 may be constituted by buttons or a sensitive unit like a touch panel. The operating unit may be a biometric identification unit, such as a unit of recognizing a fingerprint and unlocking a device. The electronic equipment including the communication unit may also be called communication equipment. The electronic equipment may have a camera function by including a lens and an imaging element. An image taken with the camera function is displayed on the display unit. The electronic equipment may be, for example, a smartphone or a notebook computer.

Figure 15A:
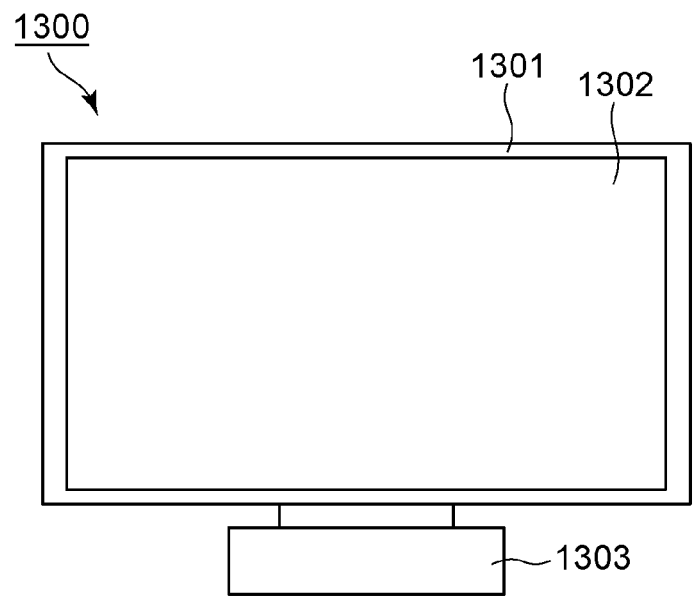
FIGS. 15A and 15B are each a schematic view illustrating another example of the display apparatus.
Figure 15B:
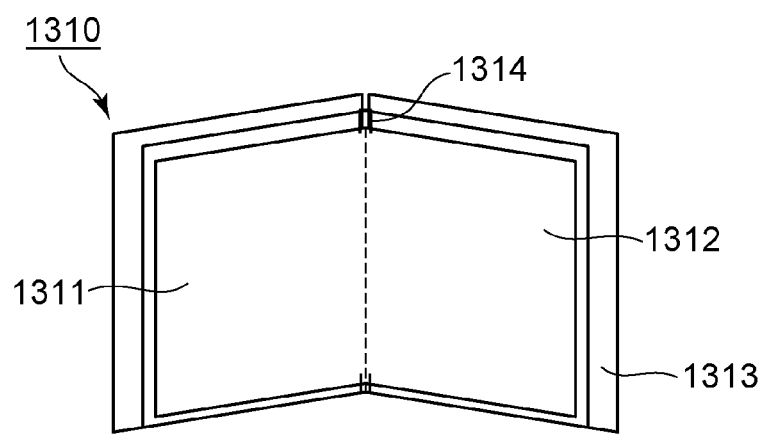

FIGS. 15A and 15B are each a schematic view illustrating another example of the display apparatus according to the embodiment. FIG. 15A represents a display apparatus 1300 such as a TV monitor or a PC monitor. The display apparatus 1300 includes a frame 1301 and a display unit 1302. The light emitting apparatus according to the embodiment may be used as the display unit 1302.

The display apparatus 1300 further includes a base 1303 supporting the frame 1301 and the display unit 1302. The base 1303 is not limited to the form illustrated in FIG. 15A. A lower edge of the frame 1301 may also serve as the base.

The frame 1301 and the display unit 1302 may have a curved shape. The radius of curvature of the curved shape may be 5000 mm or more and 6000 mm or less.

FIG. 15B is a schematic view illustrating still another example of the display apparatus according to the embodiment. A display apparatus 1310 illustrated in FIG. 15B can be folded and is generally called a foldable display apparatus. The display apparatus 1310 includes a first display unit 1311, a second display unit 1312, a casing 1313, and a folding point 1314. Each of the first display unit 1311 and the second display unit 1312 may include the light emitting apparatus according to the embodiment. The first display unit 1311 and the second display unit 1312 may be one unit of display apparatus without a seam. The first display unit 1311 and the second display unit 1312 can be separated from each other at the folding point. The first display unit 1311 and the second display unit 1312 may display different images or may display one image in a combination of both the first and second display units.

Figure 16A:
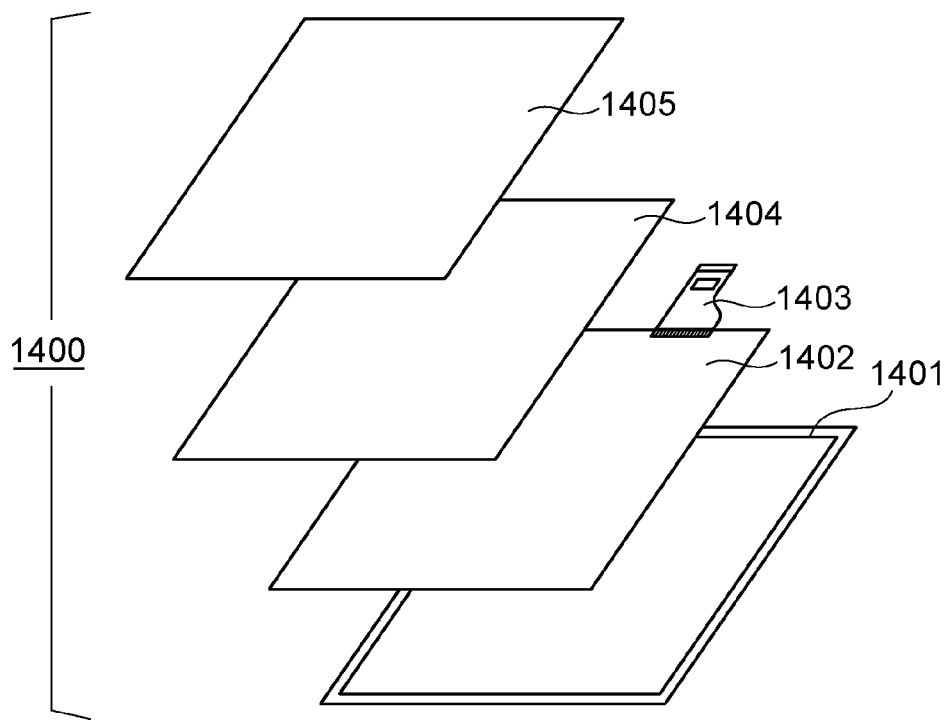
FIGS. 16A and 16B are each a schematic view illustrating an example of an illumination apparatus.

FIG. 16A is a schematic view illustrating an example of an illumination apparatus according to an embodiment. An illumination apparatus 1400 may include a casing 1401, a light source 1402, a circuit board 1403, an optical film 1404, and a light diffuser 1405. The light source 1402 may include the organic light emitting element according to the embodiment. The optical film may be an optical filter for improving a color rendering property of the light source. The light diffuser can effectively diffuse light from the light source as in a manner of lighting up an objective, and can cause the light to reach a wider space. The optical filter and the light diffuser may be disposed on a light emergent side of the illumination apparatus. A cover may be disposed on an outermost side as required.

The illumination apparatus illuminates, for example, a room. The illumination apparatus may emit not only white light and neutral white light, but also light of any color in a range from blue to red. The illumination apparatus may include a light control circuit for controlling the emitted light. The illumination apparatus may include the organic light emitting element according to the present disclosure and a power supply circuit connected to the organic light emitting element. The power supply circuit is a circuit for converting an AC voltage to a DC voltage. The word "white" implies a color with a color temperature of 4200K, and the word "neutral white" implies a color with a color temperature of 5000K. The illumination apparatus may include a color filter.

The illumination apparatus according to the embodiment may further include a heat dissipation unit. The heat dissipation unit dissipates heat in the apparatus to the outside of the apparatus and may be made of, for example, a metal with a high specific heat, or liquid silicon.

Figure 16B:
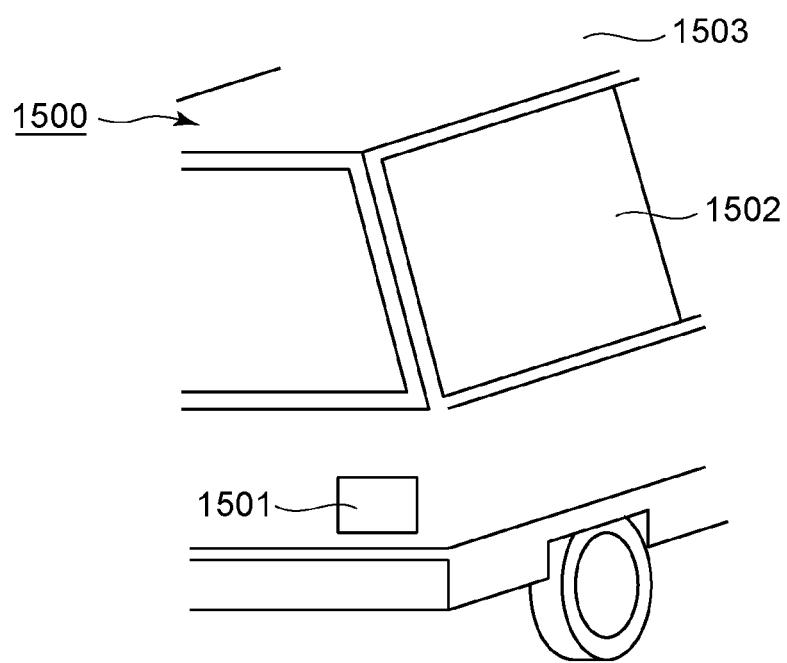

FIG. 16B is a schematic view illustrating a car as an example of a moving object according to an embodiment. The car 1500 includes a tail lamp 1501 as an example of car lightings. The tail lamp 1501 of the car 1500 may be constituted to be lit up, for example, when a brake is operated.

The tail lamp 1501 may include the organic light emitting element according to the embodiment. The tail lamp may include a protective member for protecting the organic light emitting element. The protective member may be made of any suitable material insofar as the material has a certain high level of strength and is transparent. However, the protective member is preferably made of, for example, polycarbonate. A derivative of frandicarboxylic acid or acrylonitrile, for example, may be added to the polycarbonate.

The car 1500 may include a body 1503 and a window 1502 mounted to the body 1503. The window may be a transparent display on condition that it is not a window through which a driver visually checks the front and the rear of the car. The transparent display may include the organic light emitting element according to the embodiment. In that case, components included in the organic light emitting element, such as electrodes, are formed of transparent members.

The moving object according to the embodiment may be a ship, an airplane, a drone, or the like. The moving object may include a body and a lighting disposed on the body. The lighting may generate light to inform a position of the body. The lighting includes the organic light emitting element according to the embodiment.

Application examples of the above-described display apparatuses according to the embodiments will be described below with reference to FIGS. 17A and 17B. The display apparatus can be applied to a system that can be worn by a user as a wearable device, for example, a smart glass, a HMD, a smart contact lens. An imaging and display apparatus used in such an application example includes an imaging apparatus capable of performing photoelectric conversion of visible light, and a display apparatus capable of emitting visible light.

Figure 17A:
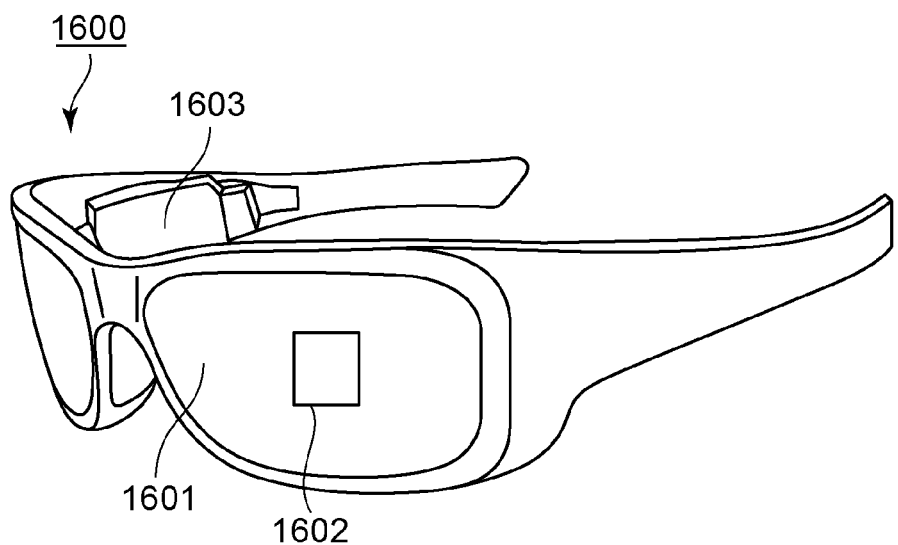
FIGS. 17A and 17B are each a schematic view illustrating an application example of the display apparatus.

FIG. 17A illustrates a pair of eyeglasses 1600 (smart glasses) representing one application example. An imaging apparatus 1602, such as a CMOS sensor or an SPAD, is disposed on a front side of a lens 1601 of each of the eyeglasses 1600. Furthermore, any one of the above-described display apparatuses according to the embodiments is disposed on a rear side of the lens 1601.

The eyeglasses 1600 further include a control device 1603. The control device 1603 functions as a power supply for supplying electric power to the imaging apparatus 1602 and the display apparatus according to the embodiment. In addition, the control device 1603 controls operations of the imaging apparatus 1602 and the display apparatus. An optical system for condensing light to the imaging apparatus 1602 is formed on the lens 1601.

Figure 17B:
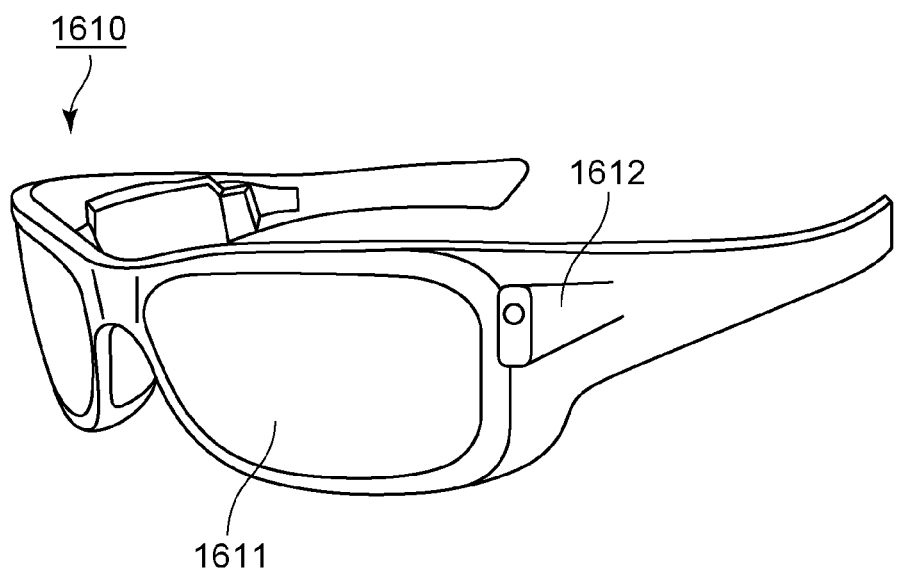

FIG. 17B illustrates a pair of eyeglasses 1610 (smart glasses) representing another application example. The pair of eyeglasses 1610 includes a control device 1612 onto which an imaging apparatus corresponding to the above-mentioned imaging apparatus 1602 and a display apparatus are mounted. Optical systems for condensing light to the imaging apparatus in the control device 1612 and projecting light from the display apparatus are formed on a lens 1611, and an image is projected onto the lens 1611. The control device 1612 functions as a power supply for supplying electric power to the imaging apparatus and the display apparatus, and controls operations of the imaging apparatus and the display apparatus. The control device may include a sight line detector for detecting a sight line of a wearer (user). The sight line may be detected using infrared radiation. An infrared light emitter emits infrared light to an eyeball of the user looking at the displayed image. Reflected light of the emitted infrared light from the eyeball is detected by an imaging unit including a light receiving element, whereby an image of the eyeball is obtained. Deterioration of image quality is reduced with the provision of a unit for reducing the light incident on the display apparatus from the infrared light emitter in a plan view.

The sight line of the user toward the displayed image is detected from the eyeball image taken by the above-described infrared imaging technique. Suitable one of known methods can be optionally applied to detect the sight line from the eyeball image. As an example, a sight line detection method on the basis of a Purkinje image formed by irradiation light reflected at the cornea can be used.

In more detail, a sight line detection process is performed in accordance with a pupil-corneal reflection method. With the pupil-corneal reflection method, a sight line vector representing a direction (rotation angle) of the eyeball is calculated on the basis of a pupil image and a Purkinje image both included in the eyeball image, whereby the sight line of the user is detected.

A display apparatus according to an embodiment of the present disclosure may include an imaging apparatus with a light receiving element and may control a displayed image on the display apparatus in accordance with information about the sight line of the user, the information being provided from the imaging apparatus.

More specifically, the display apparatus determines, on the basis of the sight line information, a first visual region at which the user is looking, and a second visual region other than the first visual region. The first visual region and the second visual region may be determined by a control device in the display apparatus, or may be obtained by receiving those visual regions that have been determined by an external control device. In a display region of the display apparatus, a display resolution in the first visual region may be controlled to be higher than that in the second visual region. In other words, the display resolution may be set to be lower in the second visual region than in the first visual region.

Moreover, the display region includes a first display region and a second display region different from the first display region, and one of the first display region and the second display region, the one having higher priority, is determined on the basis of the sight line information. The first display region and the second display region may be determined by the control device in the display apparatus, or may be obtained by receiving those display regions that have been determined by an external control device. A resolution in the region with higher priority may be controlled to be higher than that in the region other than the region with higher priority. In other words, the resolution may be set to be lower in the region with relatively low priority.

AI may be used to determine the first visual region or the region with higher priority. The AI may be a model configured to estimate, from the eyeball image, an angle of the sight line and a distance to an objective in front of the sight line by using, as teacher data, the eyeball image and a direction in which the eyeball in the image is actually looking. An AI program may be installed in any one of the display apparatus, the imaging apparatus, and an external device. When the AI program is installed in the external device, the AI program is transmitted to the display apparatus via communication.

When display control is to be performed in accordance with visual recognition, the present disclosure can be preferably applied to a smart glass that further includes an imaging apparatus configured to take an image of an external field. The smart glass can display in real time information obtained by taking the image of the external field.

As described above, display ensuring good image quality and being stable even for a long time can be presented by using the apparatus equipped with the organic light emitting element according to the embodiment.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-178127, filed Oct. 23, 2020, which is hereby incorporated by reference herein in its entirety.

What is claimed is:

1. An electronic device comprising elements arranged on a substrate, each of the elements including an insulating layer, a first electrode, a functional layer, and a second electrode in mentioned order starting from a side closer to the substrate, the functional layer and the second electrode being continuously arranged to cover two of the first electrodes independently included in adjacent two of the elements from a position on one of the two first electrodes to a position on the other first electrode,
wherein the insulating layer has an inclined portion that is inclined relative to the substrate,
the first electrode has a first portion positioned on the inclined portion and a second portion in contact with the functional layer, the second portion having a smaller inclination angle relative to the substrate than the first portion, and
a thickness of the functional layer positioned on the first portion in a direction normal to a functional layer surface in contact with the first portion is smaller than a thickness of the functional layer positioned on the second portion in a direction normal to a functional layer surface in contact with the second portion,
the elements include a first element configured to emit first light and a second element configured to emit second light,
each of the first element and the second element further includes, between the second portion and the substrate, a reflecting layer and a portion of the insulating layer in mentioned order starting from the side closer to the substrate,
a thickness of the portion of the insulating layer included in the first element and a thickness of the portion of the insulating layer included in the second element are different from each other,
the insulating layer has a flat portion at a position farther away from the substrate than the second portion,
the reflecting layer is arranged under the second portion and the flat portion,
a thickness of a portion of the reflecting layer in a direction vertical to the substrate, the portion being positioned under the flat portion, is greater than a thickness of a portion of the reflecting layer in the direction vertical to the substrate, the portion being positioned under the second portion, and
the insulating layer is arranged to cover a step formed between the portion of the reflecting layer positioned under the second portion and the portion of the reflecting layer positioned under the flat portion.

2. The electronic device according to claim 1, wherein the inclination angle of the second portion relative to the substrate is 15° or smaller.

3. The electronic device according to claim 1, wherein the first portion is arranged to surround the second portion.

4. The electronic device according to claim 1, further comprising a second insulating layer arranged between the first electrode and the functional layer.

5. The electronic device according to claim 1, wherein the insulating layer has a flat portion at a position farther away from the substrate than the second portion, and
the first electrode is arranged on the insulating layer to cover an end portion of the flat portion and the inclined portion.

6. A display apparatus comprising:
the electronic device according to claim 1; and
transistors connected to the elements.

7. A display apparatus comprising:
an imaging apparatus; and
the electronic device according to claim 1, serving as a display unit,
wherein an image displayed on the display unit is controlled in accordance with information about a sight line of a user, the information being provided from the imaging apparatus.

8. A photoelectric conversion apparatus comprising:
an optical unit including lenses; and
an imaging element arranged to receive light having passed through the optical unit; and
a display unit configured to display an image taken by the imaging element,
wherein the display unit includes the electronic device according to claim 1.

9. An electronic equipment comprising:
a display unit including the electronic device according to claim 1;
a casing in which the display unit is disposed; and
a communication unit disposed in the casing and configured to communicate with an outside.

10. An illumination apparatus comprising:
a light source including the electronic device according to claim 1; and
a light diffuser or an optical film through which light emitted from the light source passes.

11. A moving object comprising:
a lighting including the electronic device according to claim 1; and
a body on which the lighting is disposed.

12. The electronic device according to claim 4, wherein the second insulating layer is arranged on the first portion to cover the first portion.

13. The electronic device according to claim 4, wherein the first electrode has a third portion between the first portion and the second portion, the third portion having a smaller inclination angle relative to the substrate than the first portion, and
the second insulating layer is arranged on the first portion and the third portion to cover the first portion and the third portion.

14. The electronic device according to claim 5, wherein the inclined portion of the insulating layer is arranged to surround the second portion in a plan view of the substrate, and
the flat portion of the insulating layer is arranged to surround the inclined portion in the plan view of the substrate.

15. The electronic device according to claim 5, wherein the elements include a first element configured to emit first light and a second element configured to emit second light, and
an upper surface of the flat portion of the insulating layer included in the first element and an upper surface of the flat portion of the insulating layer included in the second element are present on the same plane.

16. The electronic device according to claim 15, wherein the elements include the first element configured to emit the first light and the second element configured to emit the second light, and an upper surface of the second portion of the first electrode included in the first element and an upper surface of the second portion of the first electrode included in the second element are on different planes.

* * * * *